(12) United States Patent
Viey et al.

(10) Patent No.: US 11,761,920 B2
(45) Date of Patent: Sep. 19, 2023

(54) CONCENTRATION ESTIMATION METHOD

(71) Applicant: Commissariat à l'Énergie Atomique et aux Énergies Alternatives, Paris (FR)

(72) Inventors: Abygael Viey, Grenoble (FR); Marie-Anne Jaud, Grenoble (FR); William Vandendaele, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 300 days.

(21) Appl. No.: 17/094,621

(22) Filed: Nov. 10, 2020

(65) Prior Publication Data
US 2021/0156812 A1    May 27, 2021

(30) Foreign Application Priority Data

Nov. 26, 2019    (FR) ........................................ 1913213

(51) Int. Cl.
*G01N 27/22*    (2006.01)
*G01N 27/00*    (2006.01)
(Continued)

(52) U.S. Cl.
CPC ......... *G01N 27/221* (2013.01); *G01N 27/002* (2013.01); *H01L 29/2003* (2013.01);
(Continued)

(58) Field of Classification Search
CPC ................ G01N 27/221; G01N 27/002; H01L 29/2003; H01L 29/518; H01L 29/778;
(Continued)

(56) References Cited

U.S. PATENT DOCUMENTS

| 6,151,559 A | * | 11/2000 | Williams | ............... H04N 17/00 348/E7.052 |
| 2010/0264511 A1 | * | 10/2010 | Haji-Sheikh | ....... G01R 31/2872 257/E21.546 |

(Continued)

FOREIGN PATENT DOCUMENTS

| JP | 3062975 B2 | 7/2000 |
| JP | 2019-137566 A1 | 8/2019 |
| WO | WO 2018/123285 A1 | 7/2018 |

OTHER PUBLICATIONS

FR1913213, Jul. 31, 2020, Preliminary Search Report.
(Continued)

*Primary Examiner* — Christopher P McAndrew
*Assistant Examiner* — Zannatul Ferdous
(74) *Attorney, Agent, or Firm* — Wolf, Greenfield & Sacks, P.C.

(57) ABSTRACT

A method of estimating a nitrogen site carbon concentration, in a first epitaxial layer made of carbon-doped gallium nitride of an electronic component, including steps of: estimating an electric capacitance of a stack interposed between the first layer and a first electrode of the component; heating the component; measuring an offset of a threshold voltage of the component; and deducing therefrom a nitrogen site carbon surface concentration in the first layer.

16 Claims, 13 Drawing Sheets

(51) Int. Cl.
   *H01L 29/20*     (2006.01)
   *H01L 29/51*     (2006.01)
   *H01L 29/778*    (2006.01)
   *H01L 29/94*     (2006.01)

(52) U.S. Cl.
   CPC .......... *H01L 29/518* (2013.01); *H01L 29/778* (2013.01); *H01L 29/94* (2013.01)

(58) Field of Classification Search
   CPC ......... H01L 29/94; H01L 22/14; H01L 22/20; H01L 22/12; G01R 31/2621; G01R 31/2648
   See application file for complete search history.

(56) References Cited

U.S. PATENT DOCUMENTS

| | | | | |
|---|---|---|---|---|
| 2016/0056085 | A1* | 2/2016 | Ohashi | H01L 29/94 324/754.23 |
| 2016/0313260 | A1* | 10/2016 | Meaney | G01R 31/11 |
| 2020/0262526 | A1* | 8/2020 | Van Delden | F21S 9/00 |
| 2021/0392723 | A1* | 12/2021 | Nishioka | H05B 6/705 |
| 2022/0057338 | A1* | 2/2022 | Hatano | G01N 22/00 |

OTHER PUBLICATIONS

Preliminary Search Report for French Application No. 1913213, dated Jul. 31, 2020.
Fang et al., Deep traps in AlGaN/GaN heterostructures studied by deep level transient spectroscopy: Effect of carbon concentration in GaN buffer layers. Journal of Applied Physics. Sep. 15, 2010;108(6):063706.

* cited by examiner

CONCENTRATION ESTIMATION METHOD

CROSS-REFERENCE TO RELATED APPLICATIONS

This application claims priority to French patent application number 1913213, filed Nov. 26, 2019, the contents of which is incorporated herein by reference in its entirety.

TECHNICAL BACKGROUND

The present disclosure generally concerns electronic devices and, more particularly, electronic power components based on gallium nitride (GaN).

PRIOR ART

Gallium nitride (GaN) currently is a component of many electronic components, for example, high electron mobility transistors (HEMT). HEMT transistors comprising at least one gallium nitride crystal layer particularly enable to switch high electric currents, for example, in the order of several tens of amperes, under high bias voltages, for example, in the order of several hundreds of volts. Such transistors are further compatible with high operating frequencies, typically in the order of one megahertz.

Impurities are frequently intentionally introduced into the gallium nitride layer of gallium nitride transistors. Such impurities, for example, carbon atoms, particularly contribute to obtaining transistors having an improved voltage behavior. However, too strong a carbon concentration in the gallium nitride layer may decrease the lifetime of transistors.

Generally, it is attempted, on manufacturing of gallium nitride components, to obtain a given carbon concentration, for example enabling to reach an optimal tradeoff between the voltage behavior and the lifetime of the components. It would be desirable to be able to estimate, after manufacturing, the carbon concentration in the gallium nitride layer of such components. This would in particular enable to better control the manufacturing of gallium nitride components.

SUMMARY

There is a need to estimate the carbon concentration in the gallium nitride layer of an electronic component.

An embodiment overcomes all or part of the disadvantages of known methods for estimating the carbon concentration in the gallium nitride layer of an electronic component.

An embodiment provides a method of estimating a nitrogen site carbon concentration, in a first epitaxial carbon-doped gallium nitride layer of an electronic component, comprising steps of:

estimating an electric capacitance of a stack interposed between the first layer and a first electrode of the component;

heating the component;

measuring an offset of a threshold voltage of the component; and deducing therefrom a nitrogen site carbon surface concentration in the first layer.

According to an embodiment, said method further comprises a step comprising calculating, based on the surface concentration and on a partial thickness of the first layer, a nitrogen site carbon volume concentration in the first layer.

According to an embodiment, the heating of the component is performed at a temperature in the range from one hundred to two hundred and fifty degrees Celsius, preferably from one hundred and fifty to two hundred and fifty degrees Celsius.

According to an embodiment, the stack forms, with the first electrode, a MOS-type structure comprising:

a second gallium nitride layer located on the first layer; and a third alumina layer, penetrating into the second layer, the first electrode being located on top of and in contact with the third layer.

According to an embodiment, the capacitance is estimated according to respective thicknesses and dielectric permittivities of the second layer and of the third layer.

According to an embodiment, the first layer is located on a substrate, preferably a silicon wafer with a $\{111\}$ orientation.

According to an embodiment, the offset of the threshold voltage of the component is determined at the end of a step of application, between the first electrode and a second electrode of the component, of a negative bias voltage.

According to an embodiment, the bias voltage is smaller than $-1$ V, preferably approximately equal to $-5$ V.

According to an embodiment, the step of application of the bias voltage lasts for from one to ten thousand seconds, preferably from one hundred to ten thousand seconds.

According to an embodiment, the step of application of the bias voltage is interrupted, for from ten to one hundred microseconds, several times to estimate the threshold voltage of the component.

According to an embodiment, the threshold voltage of the component is estimated based on a measurement of the variation of the capacitance, between the first electrode and the second electrode, according to a variation of the potential applied to the first electrode.

According to an embodiment, the threshold voltage of the component is estimated based on a measurement of the variation of an electric current crossing the component, according to a variation of the potential applied to the first electrode.

According to an embodiment, the component is a transistor, preferably a high electron mobility transistor, the first electrode being a gate electrode and the second electrode being an electrode connected to the substrate.

According to an embodiment, the component is a MOS capacitor.

According to an embodiment, epitaxy parameters of the first layer are adapted according to the estimation of the nitrogen site carbon concentration.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the methods of manufacturing gallium nitride electronic components are not detailed, the invention being compatible with usual methods of manufacturing gallium nitride electronic components.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

Figure 1:
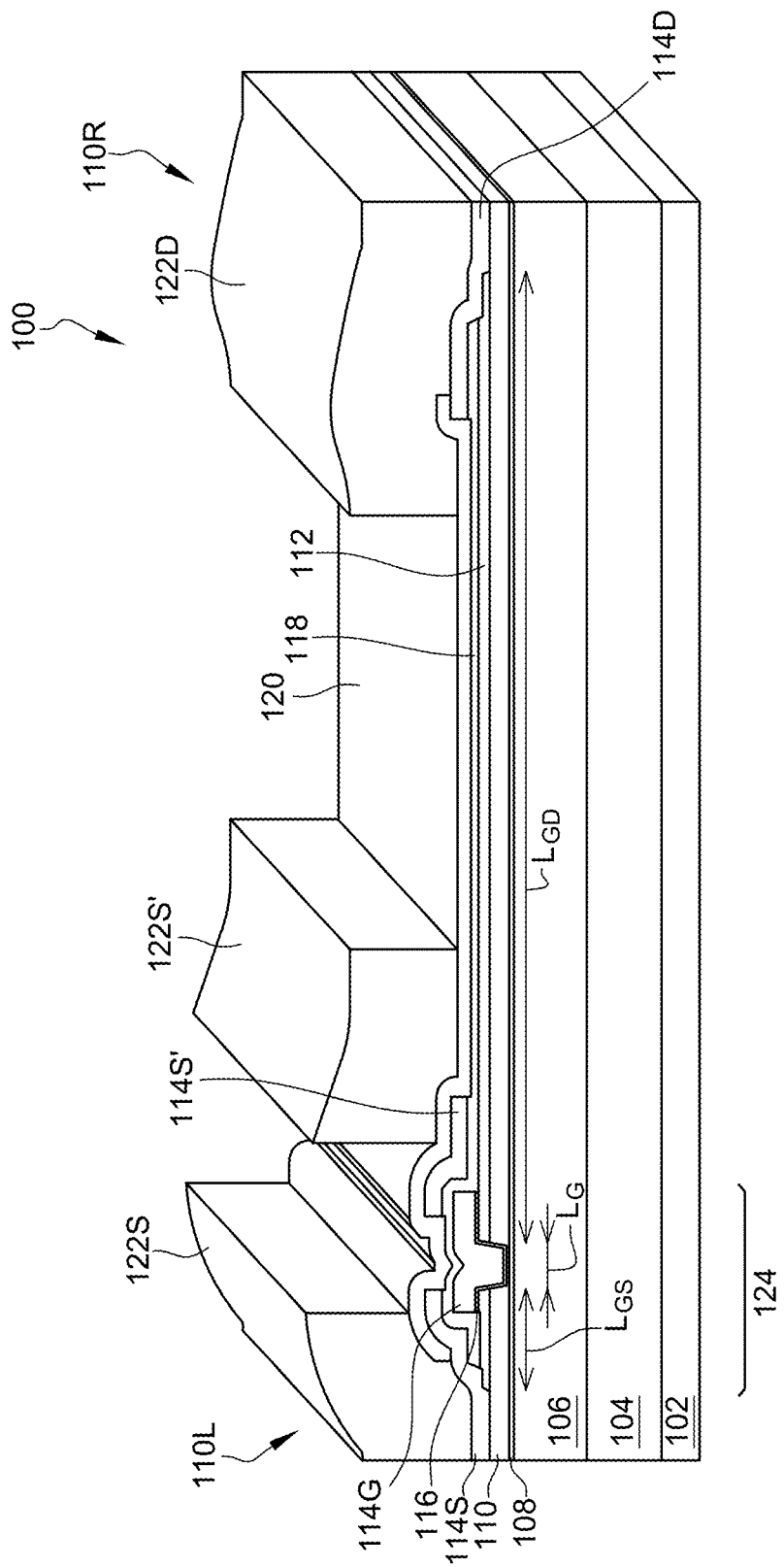
FIG. 1 is a partial simplified perspective cross-section view of an embodiment of a field-effect transistor.

FIG. 1 is a partial simplified perspective cross-section view of an embodiment of a field-effect transistor 100.

According to this embodiment, transistor 100 comprises a substrate 102. Substrate 102 is for example a wafer having a diameter of two hundred millimeters (eight inches), mainly made of crystal silicon (Si), and having a surface (the upper surface of substrate 102, in the orientation of FIG. 1) with a {111} orientation.

As illustrated in FIG. 1, a layer 104 is located on top of and in contact with the upper surface of substrate 102. Layer 104 is preferably a "full plate" layer, in other words a layer entirely covering the upper surface of substrate 102. In the embodiment of transistor 100, layer 104 is preferably a so-called transition layer having a composition different from that of substrate 102.

Another layer 106 of transistor 100 is located on top of and in contact with layer 104. Layer 106 is for example formed by epitaxial growth from a surface of transition layer 104 (the upper surface of layer 104, in the orientation of FIG. 1). Layer 104 particularly allows a progressive lattice parameter adaptation, for example causing a relaxation of the lattice stress, between substrate 102 and layer 106.

According to an embodiment, layer 106 is made of doped gallium nitride (GaN). More particularly, layer 106 has a crystal structure comprising gallium nitride cells having doping impurities, preferably carbon atoms (C), intentionally introduced therein. This means, in other words, that layer 106 forms a gallium nitride crystal lattice and that, in certain cells of the lattice, one or a plurality of atoms are each substituted with a carbon atom.

According to a preferred embodiment, the carbon atoms introduced during the epitaxy of layer 106 mainly substitute to nitrogen atoms of the gallium nitride crystal lattice. It is then said that the carbon atoms occupy nitrogen sites of the gallium nitride crystal structure of the layer 106 of transistor 100 or, more simply, that the carbon atoms are "nitrogen site" carbon atoms.

The nitrogen site carbon atoms in gallium nitride layer 106 behave as acceptors. In other words, the presence of nitrogen site carbon atoms in gallium nitride layer 106 results in a p-type doping of layer 106. This provides, in particular, a transistor 100 having a better voltage behavior than an equivalent transistor having a layer 106 comprising no nitrogen site carbon atoms.

In the rest of the description, "GaN:C" designates the composition of a layer mainly made of gallium nitride and comprising nitrogen site carbon atoms, for example, the layer 106 of transistor 100.

As illustrated in FIG. 1, transistor 100 comprises still another layer 108. Layer 108 is located on top of and in contact with layer 106. Layer 108 preferably acts as a barrier layer. In the case of transistor 100, layer 108 enables to adjust a threshold voltage value, noted $V_{TH}$, of transistor 100.

Transistor 100 comprises still another layer 110. Layer 110 is located on top of and in contact with layer 108. Layer 110 of transistor 100 is mainly made of gallium nitride. According to an embodiment, layer 110 comprises doping impurities. The impurities present in layer 110 may be unintentionally introduced during and/or after one or a plurality of steps of forming of layer 110. In this case, layer 110 is said to be unintentionally doped.

In the rest of the description, "GaN:UID" designates the composition of a layer mainly made of unintentionally doped gallium nitride, for example, layer 110 of transistor 100.

Layer 110 is partially covered with still another layer 112. According to an embodiment, layer 112 has a multilayer structure. As a variant, layer 112 has a multilayer structure.

In the orientation of FIG. 1, layer 112 is located on top of and in contact with a portion of the upper surface of layer 110. In particular, still in the orientation of FIG. 1:
a portion 110L of layer 110, located on the left-hand side of transistor 100, is not covered with layer 112; and
another portion 110R of layer 110, located on the right-hand side of transistor 100, is not covered with layer 112.

As illustrated in FIG. 1, a source electrode 114S of transistor 100 is located on top of and in contact with the portion 110L of layer 110 which is not covered with layer 112. Similarly, a drain electrode 114D of transistor 100 is located on top of and in contact with the portion 110R of layer 110 which is not covered with layer 112. Source electrode 114S and drain electrode 114D are for example formed from a same layer.

Further, a gate electrode 114G of transistor 100 is located between source electrode 114S and drain electrode 114D. Gate electrode 114G extends vertically from the upper surface of layer 112 to the lower surface of transistor 100. More particularly, gate electrode 114G crosses layer 112 across its entire thickness and penetrates into layer 110 without crossing layer 110. Further, the gate electrode 114G of transistor 100 extends laterally on layer 112. Gate electrode 114G has, in cross-section view in FIG. 1, a "T"-shaped cross-section.

According to an embodiment, gate electrode 114G is made of at least one metal and/or of at least one metal alloy.

In transistor 100, still another layer 116 is interposed between gate electrode 114G and layers 110 and 112. Layer 116 of transistor 100 is a gate oxide layer, intended to electrically insulate gate electrode 114G from layers 110 and 112. Layer 116 is preferably mainly made of alumina ($Al_2O_3$). Layer 116 has a thickness in the range from 20 nm to 40 nm, preferably equal to 30 nm.

As illustrated in FIG. 1, still another layer 118 of transistor 100 integrally covers the upper portion of the "T" formed by gate electrode 114G, and lateral surfaces of the gate oxide layer 116. Layer 118 is located on top of and in contact with the upper surface of layer 112. In the orientation of FIG. 1, layer 118 extends laterally, leftwards, all the way to source electrode 114S, and, rightwards, all the way to drain electrode 114D.

Source electrode 114S is on top of and in contact with a portion of layer 112 and a portion of layer 118, these portions being both located on the left-hand side of the "T" formed by gate electrode 114G. In the orientation of FIG. 1, drain electrode 114D is on top of and in contact with a portion of layer 112 and a portion of layer 118, these portions being both located on the right-hand side of transistor 100.

According to an embodiment, another source electrode 114S' is located on top of and in contact with a portion of layer 118 located on the right-hand side of the "T" formed by gate electrode 114G.

In transistor 100, still another layer 120 is located on top of and in contact with a portion of layer 118 located between source electrode 114S' and drain electrode 114D. As illustrated in FIG. 1, layer 120 laterally extends:
to the left of transistor 110, on source electrode 114S', over a portion of layer 118 covering gate electrode 114G and over a right-hand portion of source electrode 114S, all the way to the position above the left end of layer 118; and
to the right of transistor 100, over a left-hand portion of drain electrode 114D.

Layers 118 and 120 are preferably based on dielectric materials. As an example, layer 120 may be made of tetraethyl orthosilicate (TEOS).

Transistor 100 further comprises:
a source pad or terminal 122S, extending on top of and in contact with the left-hand portion of source electrode 114S and a left-hand portion of layer 120;
another source pad or terminal 122S' extending on top of and in contact with another portion of layer 120 located on the right-hand side of gate electrode 114G; and
a drain pad or terminal 122D, located on top of and in contact with a right-hand portion of layer 120 and a right-hand portion of drain electrode 114D.

As illustrated in FIG. 1, source pad 122S and drain pad 122D are respectively connected to source electrode 114S and to drain electrode 114D. When source pad 122S is taken to a potential node $V_S$, this amounts to taking source electrode 114S to potential $V_S$. Similarly, when drain pad 122D is taken to a potential node $V_D$, this amounts to taking source electrode 114D to potential $V_D$.

Further, although this is not shown in FIG. 1, gate electrode 114G may be coupled, preferably connected, to a gate pad or terminal. When the gate pad is taken to a potential noted $V_G$, this amounts to taking gate electrode 114G to potential $V_G$.

According to an embodiment, source electrode 114S is connected to substrate 102. The potential $V_S$ to which source electrode 114S is taken is then equivalent to a potential applied to the substrate 102 of transistor 100, generally the ground.

As illustrated in FIG. 1, the following notations are used:
$L_{GS}$ for a distance separating a lower portion of the source electrode 114S from the vertical portion of the "T" formed by gate electrode 114G;
$L_{GD}$ for a distance separating the vertical portion of the "T" formed by gate electrode 114G from a lower portion of drain electrode 114D; and
$L_G$ the length of the vertical portion of the "T" formed by gate electrode 114G.

In other words, in the orientation of FIG. 1, distance $L_{GS}$ corresponds to a lateral dimension of a portion of layer 112 located on the left-hand side of gate electrode 114G. Distance $L_{GD}$ corresponds to a lateral dimension of a portion of layer 112 located on the right-hand side of gate electrode 114G. More generally, distances $L_{GS}$, $L_{GD}$, and $L_G$ respectively correspond to the gate-source distance, to the gate-drain distance, and to the gate length of transistor 100.

According to the embodiment discussed in relation with FIG. 1, transistor 100 is a field-effect transistor, more particularly a field-effect transistor with a metal-oxide-semiconductor (MOS) or metal-insulator-semiconductor (MIS) structure. Transistor 100 is preferably a high electron mobility transistor (HEMT). Transistor 100 is said to be "normally off". In other words, transistor 100 conducts no current, or a negligible electric current, between its source electrode 114S and its drain electrode 114D when its gate electrode 114G is taken to a substantially zero electric potential.

The transistor 100 of FIG. 1 is capable of switching electric currents having an intensity in the order of 30 A under a bias voltage in the order of 600 V between its source electrode 114S and its drain electrode 114D (and thus between its source pad 122S and its drain pad 122D). Transistor 100 may in particular be used for power signal switching applications at frequencies in the order of one megahertz (MHz).

In the rest of the description, a portion 124 of transistor 100 is more particularly considered. Portion 124 is approximately centered on gate electrode 114G and includes areas of transistor 100 located in the vicinity of gate electrode 114G.

Figure 2:
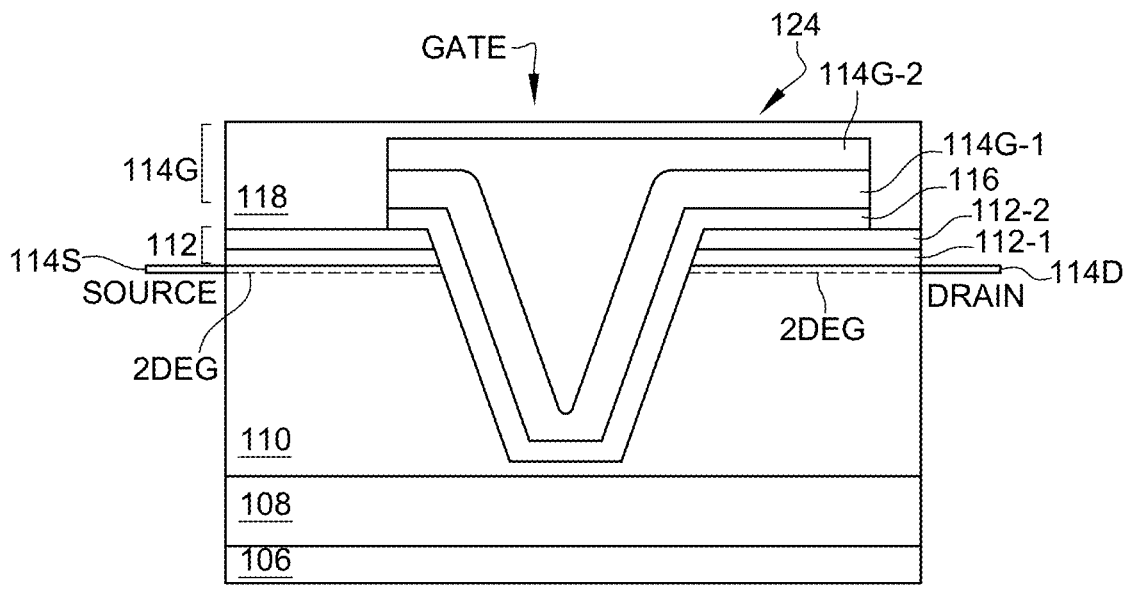
FIG. 2 is a partial simplified cross-section view of a portion of the transistor of FIG. 1 illustrating an operating mode.

FIG. 2 is a partial simplified cross-section view of the portion 124 of the transistor 100 of FIG. 1 illustrating an operating mode where transistor 100 is off.

In other words, in the operating mode of FIG. 2, transistor 100 conducts no electric current, or a current of negligible intensity, between its source electrode 114S (SOURCE) and its drain electrode 114D (DRAIN). The operating mode illustrating in FIG. 2 for example corresponds to a situation where a voltage, noted $V_{GS}$, smaller than the threshold voltage $V_{TH}$ of transistor 100 is applied between the gate electrode 114G (GATE) and the source electrode 114S of transistor 100. Transistor 100 being normally off, threshold voltage $V_{TH}$ corresponds to a limiting voltage value above which transistor 100 turns on.

The source electrode 114S of transistor 100 is for example grounded, that is, taken to a substantially null potential. Voltage $V_{GS}$ is then approximately equal to the potential $V_G$ applied to the gate electrode 114G of transistor 100.

As illustrated in FIG. 2, layer 112 has a multilayer structure comprising a sub-layer 112-1 located on top of and in contact with GaN:UID layer 110, and another sub-layer 112-2, located on top of and in contact with sub-layer 112-1. Similarly, gate electrode 114G has a multilayer structure comprising a sub-layer 114G-1, located on top of and in contact with gate oxide 116, and another sub-layer 114G-2, located on top of and in contact with sub-layer 114G-1.

According to an embodiment:
the sub-layer 112-1 of layer 112 is made of aluminum-gallium nitride (AlGaN);
the sub-layer 112-2 of layer 112 is a passivation layer capable of having a multilayer structure;
the sub-layer 114G-1 of gate electrode 114G is made of at least one metal and/or of at least one metal alloy; and
the sub-layer 114G-2 of gate electrode 114G is made of at least one metal and/or of at least one metal alloy.

Gate oxide layer 116 has, in cross-section view in FIG. 2, a "V" shape into which the "T"-shaped gate electrode 114G is inserted. Two horizontal portions of layer 116 laterally extend on top of and in contact with the sub-layer 112-2 of layer 112. Two oblique portions of layer 116 cross layer 112 and join another horizontal portion of the layer 116 formed inside of GaN:UID layer 110. The gate of transistor 100, comprising gate oxide layer 116 and gate electrode 114G, is said to be "recessed" in GaN:UID layer 110.

The gate of transistor 100 is obtained, for example, by forming a cavity inside of layer 110 and then by successively depositing, in this cavity, layer 116 and the sub-layers 114G-1 and 114G-2 of gate electrode 114G. A MOS-type gate is thus formed.

The gate of transistor 100, recessed in layer 110, separates two portions of a two-dimensional electron gas (2DEG). The two-dimensional electron gas 2DEG is symbolized in FIG. 2 by two dotted lines on either side of gate electrode 114G. As illustrated in FIG. 2, the two-dimensional electron gas 2DEG is located in GaN:UID layer 110, close to the interface between layer 110 and AlGaN sub-layer 112-1. Source and drain electrodes 114S and 114D (symbolized by two full lines in FIG. 2) are preferably connected to the two-dimensional electron gas 2DEG.

In the operating mode illustrated in FIG. 2 where the potential $V_G$ applied to gate electrode 114G is smaller than the threshold voltage $V_{TH}$ of transistor 100, the two-dimensional electron gas 2DEG is interrupted at the gate. In this operating mode, there thus exists no continuous conduction path between the source electrode 114S and the drain electrode 114D of transistor 100. Transistor 100 is thus in a non-conductive or off state.

Figure 3:
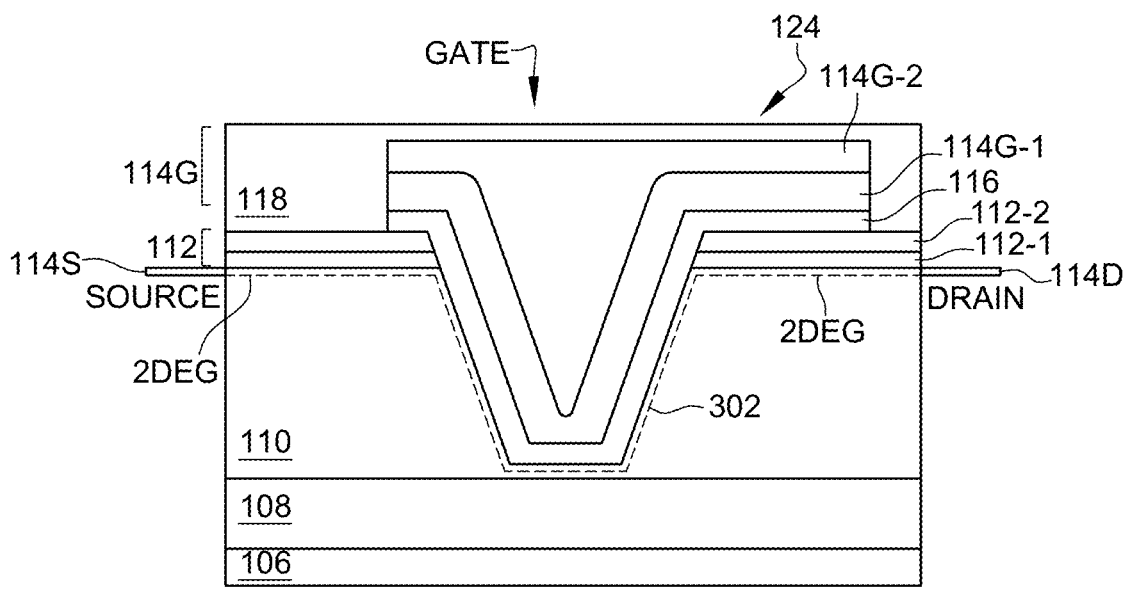
FIG. 3 is a partial simplified cross-section view of the portion of FIG. 2 of the transistor of FIG. 1 illustrating another operating mode.

FIG. 3 is a partial simplified cross-section view of the portion 124 of FIG. 2 of the transistor 100 of FIG. 1 illustrating another operating mode where transistor 100 is on.

In other words, in the operating mode of FIG. 3, transistor 100 conducts, between its source electrode 114S (SOURCE) and its drain electrode 114D (DRAIN), an electric current of non-null intensity, for example, in the order of several tens of amperes. The operating mode illustrated in FIG. 3 for example corresponds to a situation where the potential $V_G$ applied to gate electrode 114G (GATE) of transistor 100 exceeds the threshold voltage $V_{TH}$ of transistor 100.

In the operating mode illustrated in FIG. 3, the two portions of the two-dimensional electron gas 2DEG are coupled, at the level of the gate of transistor 100, by an electron channel 302. In this operating mode, there thus exists a conduction path, formed of the two portions of the two-dimensional electron gas 2DEG and of electron channel 302, between the source electrode 114S and the drain electrode 114D of transistor 100. Transistor 100 is thus in an on state.

Figure 4:
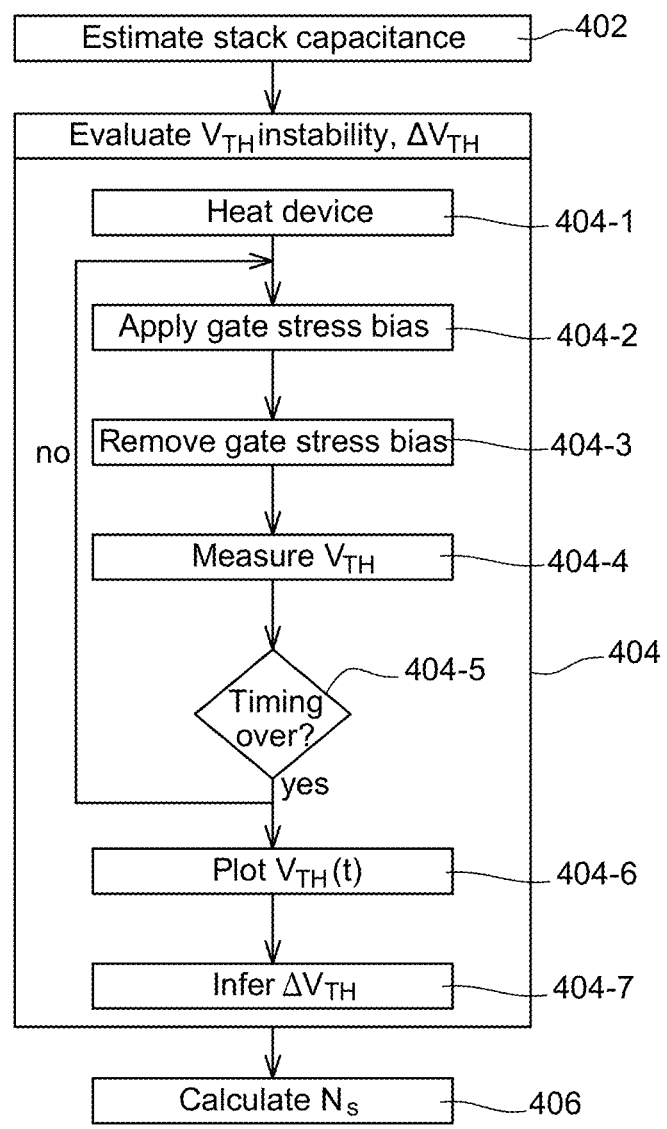
FIG. 4 is a logical diagram of the sequence of steps of an implementation mode of a method of estimation of a nitrogen site carbon concentration in a gallium nitride layer.

FIG. 4 is a logic diagram of the sequence of steps of an implementation mode of a method of estimation of a nitrogen site carbon concentration in a gallium nitride layer of a device.

The implementation mode of the method described in relation with FIG. 4 enables, for example, to estimate a nitrogen site carbon atom concentration in the GaN:C layer 106 of transistor 100 (FIG. 1).

The method illustrated in FIG. 4 comprises a step (block 402, Estimate stack capacitance) comprising estimating a value of an electric capacitance, noted $C_{eq}$, of a stack of layers. For a stack of N layers having capacitances respectively noted $C_1, C_2, \ldots, C_N$, the equivalent capacitance $C_{eq}$ of the N series-associated capacitances $C_1$ to $C_N$ is defined by the following equation:

$$C_{eq} = \frac{1}{\left(\sum_{k=1}^{N} \frac{1}{C_k}\right)} \qquad \text{[Math 1]}$$

In the case of transistor 100 (FIG. 1), equivalent capacitance $C_{eq}$ is estimated, for example, based on the capacitances of the layers between gate electrode 114G and the GaN:C layer 106 having its nitrogen site atom concentration desired to be estimated. The estimation of equivalent capacitance $C_{eq}$ in the case of transistor 100 is discussed in further detail hereafter in relation with FIG. 5.

The method illustrated in FIG. 4 comprises another step (block 404, Evaluate $V_{TH}$ instability, $\Delta V_{TH}$), subsequent to step 402. Step 404 comprises estimating an offset, noted $\Delta V_{TH}$, of the threshold voltage $V_{TH}$ of transistor 100 under the effect of the potential $V_G$ applied to the gate of transistor 100.

According to an implementation mode, step 404 comprises a sub-step (bloc 404-1, Heat device) comprising heating the device, in the present case, transistor 100. Transistor 100 is heated to a temperature in the range from one hundred degrees Celsius (100° C.) to two hundred and fifty degrees Celsius (250° C.), preferably from one hundred and fifty degrees Celsius (150° C.) to two hundred and fifty degrees Celsius (250° C.). According to this embodiment, the temperature to which transistor 100 is heated is then maintained as stable as possible until the end of step 404.

Step 404 comprises another sub-step (bloc 404-2, Apply gate stress bias), subsequent to sub-step 404-1. Sub-step 404-2 comprises applying to the gate of transistor 100 a non-null, preferably negative, gate potential $V_G$. According to an implementation mode, the gate potential $V_G$ applied to the gate of transistor 100 during sub-step 404-2 is smaller than −1 V, preferably approximately equal to −5 V. In the case where the source of transistor 100 is set to ground, the potential $V_G$ applied to the gate of transistor 100 is equivalent to gate-source bias voltage $V_{GS}$. During sub-step 404-2, transistor 100 is submitted to potential $V_G$, or to bias voltage $V_{GS}$, for a time period in the order of one tenth of a second (0.1 s).

According to a preferred embodiment, step 404-2 is preceded by an operation (not shown in FIG. 4) comprising measuring an initial value of the threshold voltage $V_{TH}$ of transistor 100. The initial value of threshold voltage $V_{TH}$ is subsequently used as a reference to determine the offset $\Delta V_{TH}$ of the threshold voltage $V_{TH}$ of transistor 100.

Step 404 comprises still another sub-step (bloc 404-3, Remove gate stress bias), subsequent to sub-step 404-2. Sub-step 404-3 comprises temporarily stopping applying a negative potential $V_G$ to the gate of transistor 100.

Step 404 further comprises another sub-step (bloc 404-4, Measure $V_{TH}$), subsequent to sub-step 404-3. Sub-step 404-4 comprises measuring the threshold voltage $V_{TH}$ of transistor 100. Operations enabling to obtain a measurement of threshold voltage $V_{TH}$ are discussed in further detail hereafter in relation with FIGS. 8 and 9.

According to an embodiment, threshold voltage $V_{TH}$ is measured during a time period in the range from ten microseconds ($10^{-5}$ s) to one hundred microseconds ($10^{-4}$ s), preferably equal to ten microseconds ($10^{-5}$ s).

Successive sub-steps 404-2, 404-3, and 404-4 are preferably repeated several times during a total duration, noted TD. Duration TD is between one second (1 s) and ten thousand seconds ($10^4$ s), preferably between one hundred seconds (100 s) and ten thousand seconds ($10^4$ s). Duration TD corresponds, to within the interruptions enabling to measure threshold voltage $V_{TH}$, to a total duration of application of potential $V_G$ during step 404.

Step 404 comprises still another sub-step (block 404-5, Timing over?), subsequent to sub-step 404-4. Sub-step 404-5 comprises testing whether duration TD has elapsed or not. If duration TD has not elapsed yet (output "no" of block 404-5), it is returned to sub-step 404-2 of application of potential $V_G$ and the operations of successive sub-steps 404-2, 404-3, and 404-4 are repeated.

If duration TD has elapsed (output "yes" of block 404-5), potential $V_G$ is no longer applied and threshold voltage $V_{TH}$ is no longer measured. Step 404 is then continued by proceeding to still another sub-step (block 404-6, pad $V_{TH}$(t)), subsequent to sub-step 404-5 in the case where duration TD has elapsed. According to an implementation mode, sub-step 404-6 comprises plotting a curve of the variation, over time t, of threshold voltage $V_{TH}$ based on the different values measured during sub-step 404-4.

Step 404 comprises still another sub-step (block 404-7, Infer $\Delta V_{TH}$), subsequent to sub-step 404-6. According to an implementation mode, sub-step 404-7 comprises deducing, from the curve obtained during sub-step 404-6, the offset $\Delta V_{TH}$ of the threshold voltage $V_{TH}$ of transistor 100 under the effect of the application of potential $V_G$ during time period TD during step 404. According to a preferred implementation mode, it is based, in order to deduce offset $\Delta V_{TH}$, on the initial value of the threshold voltage $V_{TH}$ of transistor 100 such as previously measured at step 404-2 of application of gate potential $V_G$.

The method illustrated in FIG. 4 comprise still another step (block 406, Calculate $N_S$), subsequent to step 404. Step 406 comprises calculating a surface concentration, noted $N_S$, of nitrogen site carbon in the GaN:C layer of the studied device. Surface concentration $N_S$ is calculated from:
- the equivalent capacitance $C_{eq}$, obtained at the end of step 402;
- the offset $\Delta V_{TH}$ of threshold voltage $V_{TH}$, obtained at the end of step 404; and
- the elementary charge, noted q, approximately equal to $1.6 \cdot 10^{-19}$ C.

More particularly, surface concentration $N_S$ is calculated by applying the following formula:

$$N_S = \frac{C_{eq} \times \Delta V_{TH}}{q} \qquad \text{[Math 2]}$$

According to an implementation mode, a volume concentration, noted $N_V$, is then calculated from surface concentration $N_S$ and from a partial thickness, noted $t_{eff}$, of layer 106. Volume concentration $N_V$ is for example calculated during a step (not shown in FIG. 4) subsequent to step 406. In the rest of the description, partial thickness $t_{eff}$ is also called effective thickness. Effective thickness $t_{eff}$ is preferably in the order of one hundred nanometers.

More particularly, volume concentration $N_V$ is calculated by applying the following formula:

$$N_V = \frac{N_S}{t_{eff}} \qquad \text{[Math 3]}$$

In the case of transistor 100, the implementation of the method discussed hereabove in relation with FIG. 4 particularly enables to estimate the nitrogen site surface concentration $N_S$ in carbon-doped gallium nitride epitaxial layer 106 (FIG. 1). The estimation of surface concentration $N_S$ is in particular valid for an area of layer 106 located in the vicinity of the interface between layer 106 and layer 108 (FIG. 1).

An advantage of the implementation mode discussed in relation with FIG. 4 lies in the fact that the estimation of the nitrogen site carbon surface concentration $N_S$ in layer 106 enables to adapt epitaxy parameters of layer 106. During steps of development of an electronic component, for example, the transistor 100 of FIG. 1, epitaxy parameters of layer 106 may be varied to obtain a transistor 100 having satisfactory electric performances (for example, the voltage behavior, the switching frequency, the voltage drop, etc.). The nitrogen site carbon surface concentration $N_S$ in the layer 106 of this transistor 100 is then estimated. After having manufactured other similar transistors 100, other measurements of surface concentration $N_S$ in the layers 106 of these other transistors may be performed. A repeatability of a manufacturing process of transistors 100 is thus for example controlled.

It could have been devised to estimate the carbon concentration in the layer 106 of transistor 100 by one of the current analysis techniques, for example, by secondary ion mass spectroscopy (SIMS). However, current technologies do not enable to accurately quantize the nitrogen site carbon concentration in a gallium nitride layer such as layer 106 of transistor 100.

Figure 5:
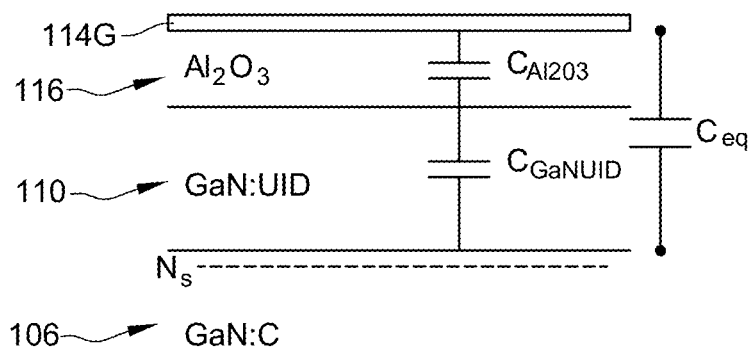
FIG. 5 is a circuit equivalent to the portion of FIG. 2 of the transistor of FIG. 1.

FIG. 5 is a circuit equivalent to portion 124 of the transistor 100 of FIG. 1. FIG. 5 in particular illustrates an implementation mode, in the case of transistor 100, of the step 402 of the method discussed in relation with FIG. 4.

FIG. 5 only shows carbon-doped gallium nitride layer 106 (GaN:C), unintentionally-doped gallium nitride layer 110 (GaN:UID), and alumina layer 116 ($Al_2O_3$). For simplification, layer 108 is here omitted from stack 124. It is assumed that:

layer 110 has a capacitance noted $C_{GaNUID}$; and
layer 116 has a capacitance noted $C_{Al2O3}$.

Equivalent capacitance $C_{eq}$ corresponds, in this example, to the capacitance of the layers forming a stack separating gate electrode 114G (FIG. 1) from GaN:C layer 106 having its nitrogen site carbon surface concentration $N_S$ desired to be estimated, as discussed in relation with the implementation mode of FIG. 4.

In the case of FIG. 5, where layer 108 is omitted, the equivalent capacitance $C_{eq}$ of the stack formed by layers 110 and 116 is then obtained the following formula:

$$C_{eq} = \frac{1}{\frac{1}{C_{GaNUID}} + \frac{1}{C_{Al2O3}}} \quad \text{[Math 4]}$$

According to an implementation mode, capacitances $C_{GaNUID}$ and $C_{Al2O3}$ are estimated according to respective thicknesses and dielectric permittivities of layers 110 and 116. The respective thicknesses and dielectric permittivities of layers 110 and 116 are preferably theoretically estimated. As a variant, the respective thicknesses and/or dielectric permittivities of layers 110 and 116 are obtained by at least one measurement performed on transistor 100.

Figure 6:
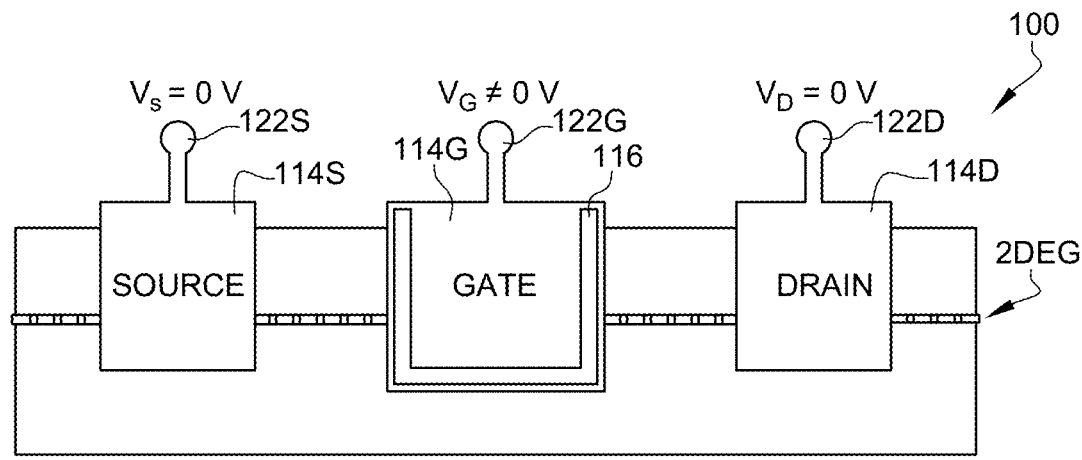
FIG. 6 is a partial simplified cross-section view of the transistor of FIG. 1.

FIG. 6 is a partial simplified cross-section view of the transistor 100 of FIG. 1. FIG. 6 particularly illustrates an implementation mode, in the case of transistor 100, of an electric configuration of transistor 100 during sub-step 404-2 of the method discussed in relation with FIG. 4.

During sub-step 404-2 (FIG. 4):
the source potential $V_S$ to which the source electrode 114S of transistor 100 is taken is substantially null ($V_S$=0 V);
the drain potential $V_D$ to which the drain electrode 114D of transistor 100 is taken is substantially null ($V_D$=0 V); and the gate potential $V_G$ to which the gate electrode 114G of transistor 100 is taken is non null ($V_G \neq 0$ V), preferably negative.

The source electrode 114S and the drain electrode 114D of transistor 100 are both set to ground. According to an implementation mode, the non-null gate potential $V_G$ is imposed, on a gate pad 122, by a voltage source external to transistor 100, for example, by a measurement device (not shown).

Figure 7:
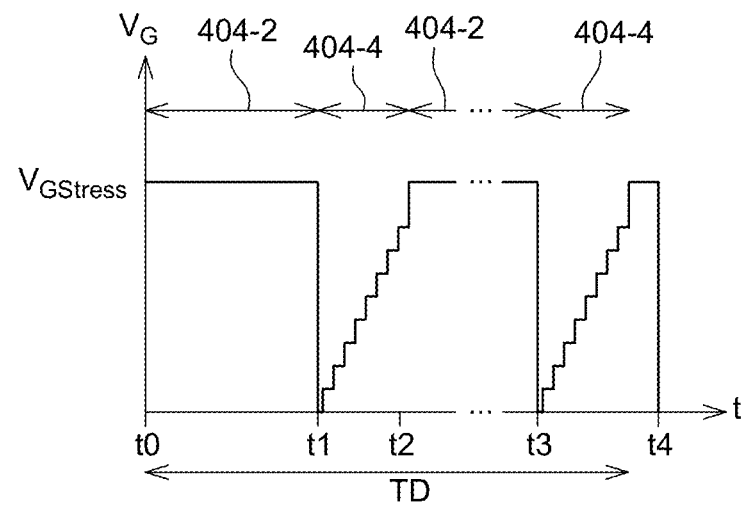
FIG. 7 is a timing diagram of the variation of a gate potential.

FIG. 7 is a timing diagram of the variation, over time t, of the absolute value of the gate potential $V_G$ to which the gate electrode 114G of transistor 100 is taken. In particular, FIG. 7 partially illustrates an implementation mode of step 404 of the method discussed in relation with FIG. 4.

At a time t0, a gate potential $V_G$ equal, in absolute value, to a value noted $V_{Gstress}$, is applied to the gate electrode 114G of transistor 100. Source electrode 114S being grounded, this amounts to applying, between gate electrode 114G and source electrode 114S, a bias voltage $V_{GS}$ equal to $V_{Gstress}$. Gate potential $V_G$ is maintained substantially equal to value $V_{GStress}$ until a time t1, subsequent to time t0.

At time t1, a substantially null potential $V_G$ is applied to the gate electrode 114G of transistor 100. Then, from time t1 and until a time t2 subsequent to time t1, a measurement of the threshold voltage $V_{TH}$ of transistor 100 is measured. The measurement of threshold voltage $V_{TH}$ is performed, as illustrated in FIG. 7, by applying in stages, to the gate electrode 114G of transistor 100, increasing values of gate potential $V_G$. Although this is not shown in FIG. 7, a measurement of the drain current, noted $I_D$, is performed at each stage, and thus for each new value of potential $V_G$.

The operations performed between times t0 and t1, respectively between times t1 and t2, correspond to sub-step 404-2, respectively to sub-step 404-4, of the implementation mode of the method discussed in relation with FIG. 4.

Assuming that total duration TD has not elapsed at time t2, a new cycle of application of potential $V_{GStress}$ and of measurement of threshold voltage $V_{TH}$ then starts at time t2. A plurality of cycles of this type may thus follow one another between time t2 and a time t3, subsequent to time t2, at which an ultimate measurement 404-4 of the threshold voltage $V_{TH}$ of transistor 100 starts.

Such an ultimate measurement 404-4 of the threshold voltage $V_{TH}$ of transistor 100 ends at a time t4, subsequent to time t3. Assuming that duration TD has elapsed between times t3 and t4, the gate electrode 114G of transistor 100 is taken to a null potential $V_G$ from time t4. At time t4, it can then be proceeded to the sub-step 404-6 of the method discussed in relation with FIG. 4.

Figure 8:
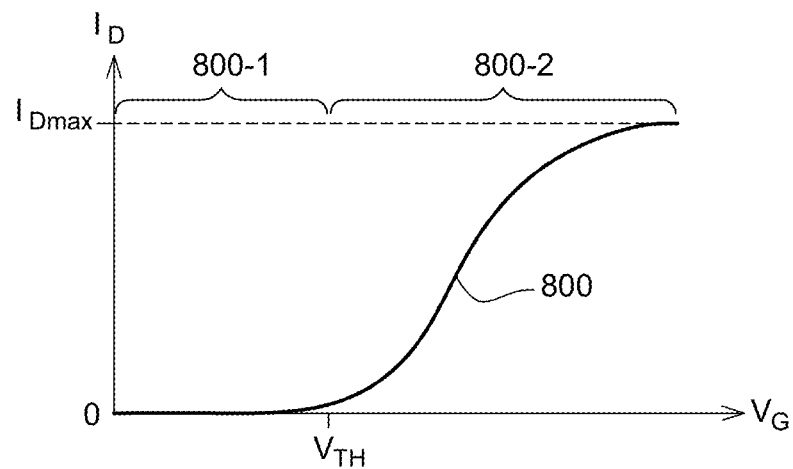
FIG. 8 is a graph of the variation of a drain current according to a gate potential.

FIG. 8 is a graph of the variation of a drain current according to a gate potential. In particular, FIG. 8 illustrates an example of a curve 800 of the variation, during sub-step 404-4 of measurement of threshold voltage $V_{TH}$, of the drain current ID of transistor 100 according to gate potential $V_G$.

As illustrated in FIG. 8, curve 800 of the variation of gate current ID according to the gate potential $V_G$ of transistor 100 has:

a portion 800-1 (on the left-hand side, in FIG. 8) where the drain current ID is substantially null; and
another portion 800-2 (on the right-hand side, in FIG. 8) when drain current ID progressively increases from a value approximately equal to zero up to a maximum value, noted $I_{D\ max}$.

The value of potential $V_G$ for which drain current ID starts notably increasing, in other words the value of potential $V_G$ for which it is passed from portion 800-1 of curve 800 to the portion 800-2 of curve 800 is approximately equal to the threshold voltage $V_{TH}$ of transistor 100. The measurement of the drain current ID of transistor 100 according to gate potential $V_G$ thus is a way to access the threshold voltage $V_{TH}$ of transistor 100.

Figure 9:
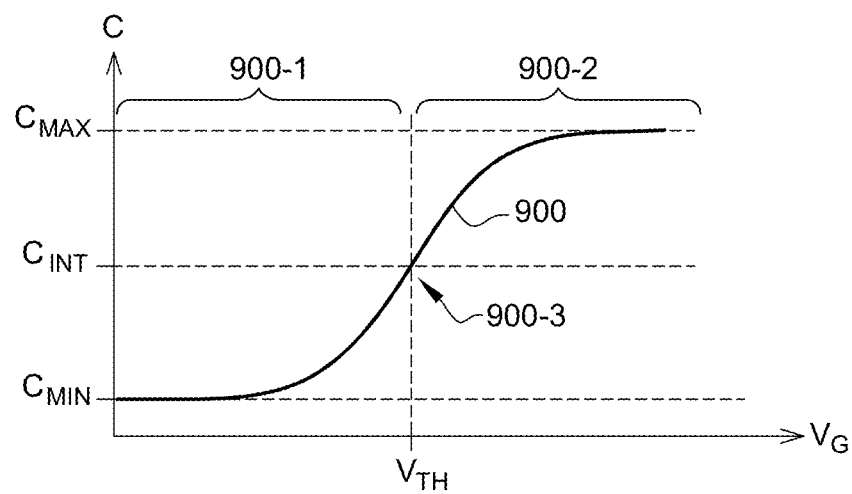
FIG. 9 is a graph of the variation of a capacitance according to a gate potential.

FIG. 9 is a graph of the variation of a capacitance according to a gate potential. In particular, FIG. 9 illustrates an example of a curve 900 of the variation, during sub-step 404-4 (FIG. 4) of measurement of threshold voltage $V_{TH}$, of a gate capacitance C of transistor 100 according to gate potential $V_G$.

As illustrated in FIG. 9, curve 900 of the variation of gate capacitance C according to the gate potential $V_G$ of transistor 100 has:
- a portion 900-1 (on the left-hand side, in FIG. 9) where capacitance C increases from a minimum value, noted $C_{MIN}$, until an intermediate value, noted $C_{INT}$; and
- another portion 900-2 (on the right-hand side in FIG. 9) where capacitance C increases from value $C_{INT}$ to a maximum value, noted $C_{MAX}$.

In FIG. 9, curve 900 has an inflexion point 900-3 marking a separation between portion 900-1 and portion 900-2. The value of potential $V_G$ corresponding to the inflexion point 900-3 of curve 900, in other words the value of potential $V_G$ for which it is passed from portion 900-1 of curve 900 to portion 900-2 of curve 900, is approximately equal to the threshold voltage $V_{TH}$ of transistor 100. The measurement of capacitance C of transistor 100 according to gate potential $V_G$ thus is another way to access the threshold voltage $V_{TH}$ of transistor 100.

Figure 10:
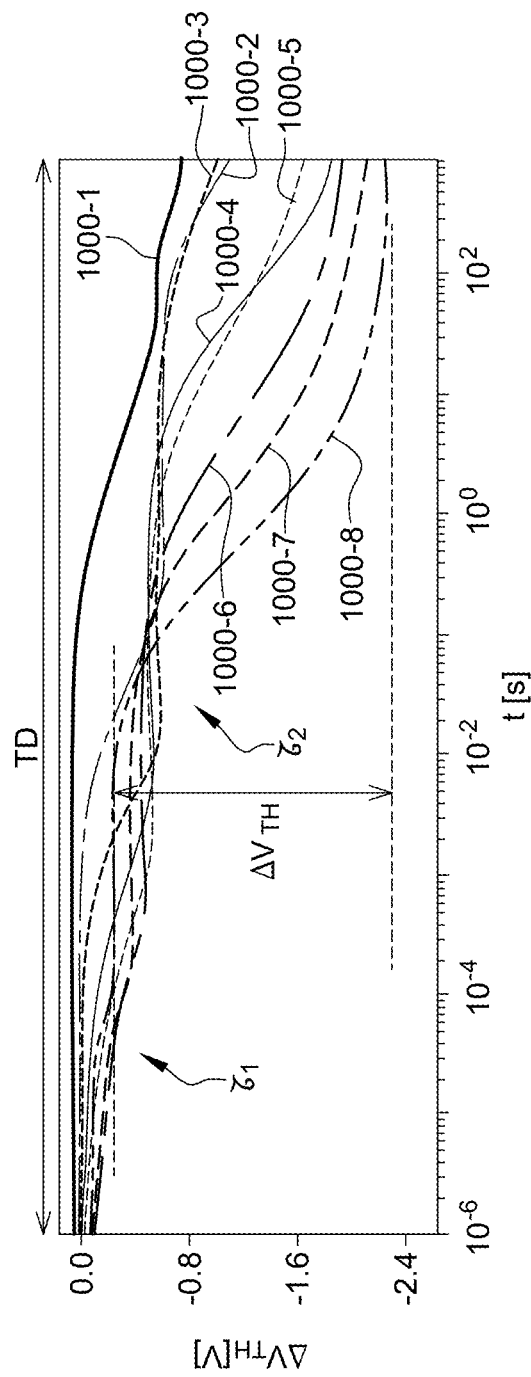
FIG. 10 is a graph of the time variation for different temperatures of an offset of a threshold voltage of an electronic component.

FIG. 10 is a graph of the time variation for different temperatures of an offset of a threshold voltage of an electronic component. In particular, FIG. 10 illustrates examples of curves 1000-1, 1000-2, 1000-3, 1000-4, 1000-5, 1000-6, 1000-7, and 1000-8 of the variation, over time t (in seconds), of the offset $\Delta V_{TH}$ (in volts) of the threshold voltage $V_{TH}$ of transistor 100. In the example of FIG. 10, transistor 100 has a 0.25-μm gate length $L_G$ (FIG. 1) and a 200-μm gate width. Curves 1000-1 to 1000-8 are obtained by applying a potential $V_{Gstress}$ (FIG. 7) of approximately −5 V.

The curves 1000-1 to 1000-8 of FIG. 10 for example result from the implementation of step 404 of the method discussed in relation with FIG. 4 for different heating temperatures of transistor 100. More particularly, in the example of FIG. 10, curves 1000-1 to 1000-8 correspond to a heating of transistor 100, during step 404, at temperatures respectively equal to twenty-five degrees Celsius (25° C.), seventy five degrees Celsius (75° C.), one hundred degrees Celsius (100° C.), one hundred and twenty five degrees Celsius (125° C.), one hundred and fifty degrees Celsius (150° C.), one hundred and seventy five degrees Celsius (175° C.), two hundred degrees Celsius (200° C.), and two hundred and twenty five degrees Celsius (225° C.).

The curves 1000-1 to 1000-8 of FIG. 10 each have two time constants, noted $\tau_1$ and $\tau_2$, respectively associated with two plateaus. Curve 1000-8 particularly exhibits a plateau between approximately one hundred microseconds ($10^{-4}$ s) and ten milliseconds ($10^{-2}$ s), having time constant $\tau_1$ associated therewith, and another plateau starting around one hundred seconds ($10^2$ s), having time constant $\tau_2$ associated therewith. The difference between the two plateaus enables, as illustrated in FIG. 10, to estimate the value of offset $\Delta V_{TH}$.

In FIG. 10, it can be seen that the higher the heating temperature of transistor 100 during step 404, the higher offset value $\Delta V_{TH}$.

Figure 11:
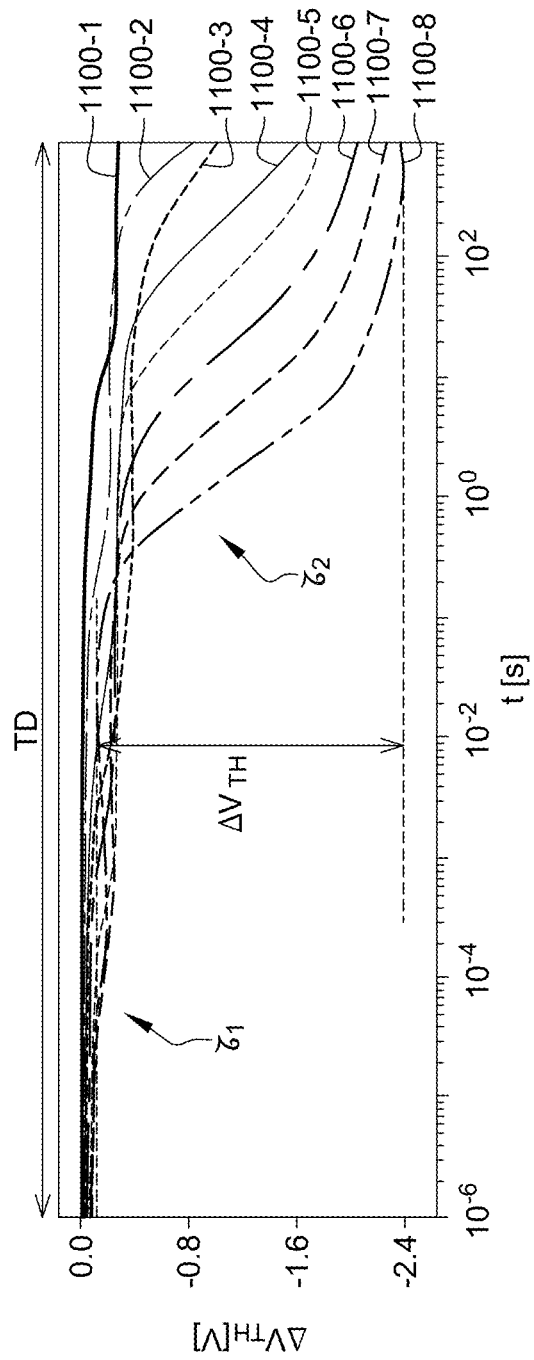
FIG. 11 is a graph of the time variation for different temperatures of an offset of a threshold voltage of another electronic component.

FIG. 11 is a graph of the time variation for different temperatures of an offset of a threshold voltage of another electronic component. In particular, FIG. 11 illustrates examples of curves 1100-1, 1100-2, 1100-3, 1100-4, 1100-5, 1100-6, 1100-7, and 1100-8 of the variation over time t (in seconds) of the offset $\Delta V_{TH}$ (in volts) of the threshold voltage $V_{TH}$ of transistor 100.

The curves 1100-1 to 1100-8 of FIG. 11 are obtained in conditions similar to those of curves 1000-1 to 1000-8 of FIG. 10, respectively, except for the fact that, in FIG. 11, transistor 100 has a gate length equal to 20 μm.

Figure 12:
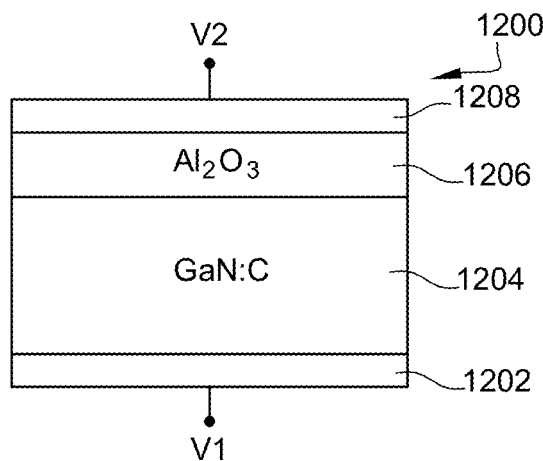
FIG. 12 is a partial simplified cross-section view of an example of a capacitor.

FIG. 12 is a partial simplified cross-section view of an example of a capacitor 1200.

In the example of FIG. 12, capacitor 1200 is a metal-oxide-semiconductor (MOS) capacitor. Capacitor 1200 comprises:
- an electrode 1202 taken to a potential V1;
- a carbon-doped gallium nitride layer 1204 (GaN:C) located on top of and in contact with electrode 1202;
- an alumina layer 1206 ($Al_2O_3$), located on top of and in contact with layer 1204; and
- another electrode 1208, located on top of and in contact with layer 1206, and taken to a potential V2.

Layer 1204 and layer 1206 of capacitor 1200 are respectively similar to the layers 106 and 116 of the transistor 100 of FIG. 1.

The implementation mode of the method discussed hereabove in relation with FIG. 4 may be adapted to the estimation of a nitrogen site carbon concentration in the GaN:C layer 1204 of MOS capacitor 1200. Potential V1 may possibly be for example substantially null while potential V2 is for example similar to the potential $V_G$ discussed hereabove in relation with FIG. 7. Threshold voltage $V_{TH}$ corresponds, in the case of MOS capacitor 1200, to a limiting voltage between an inversion mode and a depletion mode of MOS capacitor 1200.

The adaptation of the implementation mode of the method discussed hereabove in relation with FIG. 4 to the case of MOS transistor 1200 is within the abilities of those skilled in the art based on the above indications.

Figure 13:
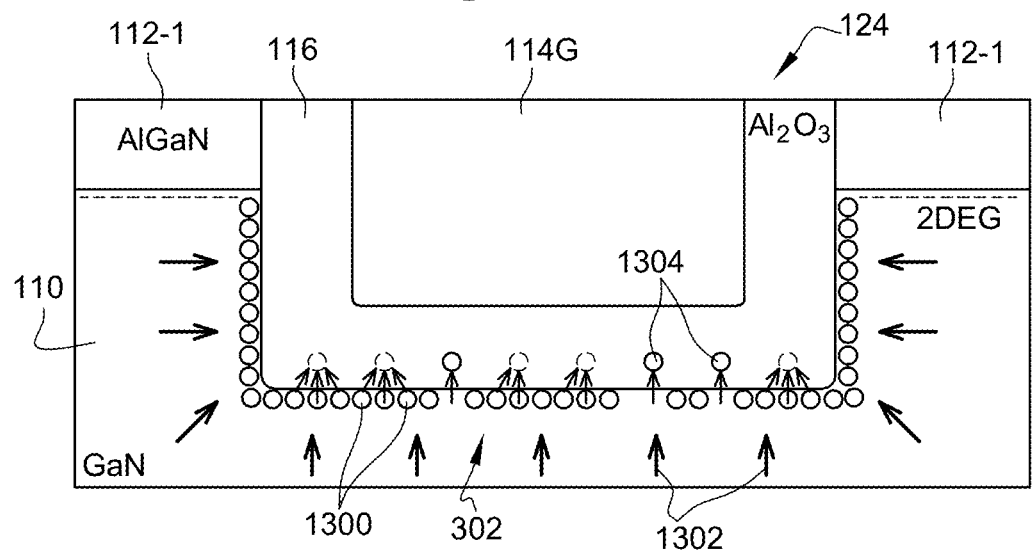
FIG. 13 is a partial simplified cross-section view of the portion of FIG. 2 of the transistor of FIG. 1 in still another operating mode.

FIG. 13 is a partial simplified cross-section view of the portion 124 of FIG. 2 of the transistor 100 of FIG. 1 in still another operating mode.

FIG. 13 particularly illustrates a situation where a gate potential $V_G$ greater than threshold voltage $V_{TH}$ starts being applied to transistor 100. In such a situation, charges 1300 forming part of the electron channel 302 formed between the two portions of the two-dimensional electron gas 2DEG are submitted to an electric field (symbolized by arrows 1302) directed towards gate electrode 114G. This causes the trapping, in gate oxide layer 116, of charges 1304 originating from electron channel 302. The operating mode illustrated in FIG. 13 is called "accumulation state" due to the fact that charges, here electrons, are accumulated in gate oxide layer 116.

Figure 14:
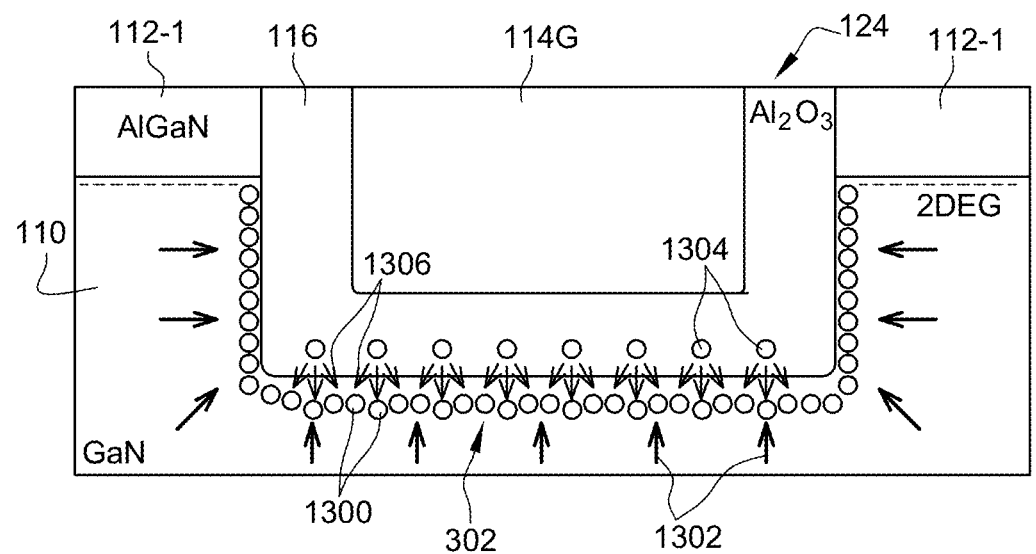
FIG. 14 is a partial simplified cross-section view of the portion of FIG. 2 of the transistor of FIG. 1 in still another operating mode.

FIG. 14 is a partial simplified cross-section view of the portion 124 of FIG. 2 of the transistor 100 of FIG. 1 in still another operating mode.

FIG. 14 particularly illustrates a situation where a gate potential $V_G$ greater than threshold voltage $V_{TH}$ has been applied for several seconds to transistor 100. In such a situation, the charges 1304 trapped in gate oxide layer 116 each generate an electric field (symbolized by arrows 1306). The electric field 1306 generated by each charge 1304 tends to oppose the electric field 1302 of the charges 1300 of electron channel 302.

The presence of charges 1304 in layer 116 causes a phenomenon called bias temperature instability (BTI). This phenomenon particularly causes a progressive degradation of the electric performance of transistor 100. Such a phenomenon particularly seems to be responsible for the offset $\Delta V_{TH}$ of the threshold voltage $V_{TH}$ of transistor 100.

Figure 15:
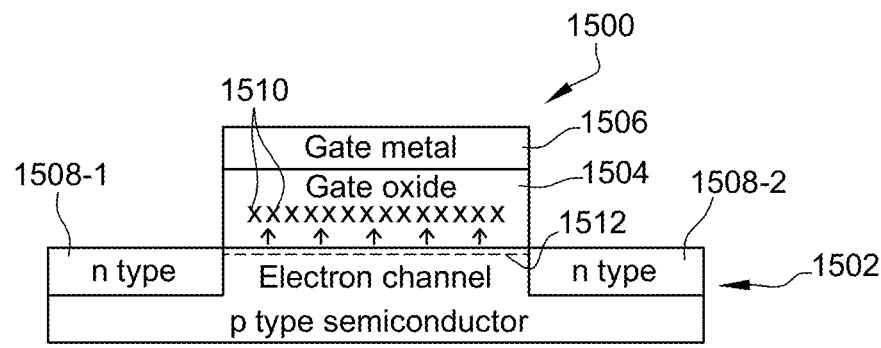
FIG. 15 is a partial simplified view of a transistor in an operating mode.

FIG. 15 is a partial simplified view of a transistor 1500 in an operating mode.

Transistor 1500 is an n-channel MOS transistor (nMOS) comprising:
- a layer 1502 (p-type semiconductor) made of a p-type doped semiconductor;
- a gate oxide layer 1504 (Gate oxide), located on top of and in contact with a portion of layer 1502;
- a gate metal layer 1506 (Gate metal), located on top of and in contact with gate oxide layer 1504; and
- two regions 1508-1 (n-type) and 1508-2 (n-type) made of n-type doped semiconductor material, formed in layer 1502 on either side of gate oxide layer 1504.

It is assumed that regions 1508-1 and 1508-2 are respectively connected to the source and to the drain of transistor 1500. It is further assumed that:
- the source of transistor 1500 is taken to a null potential, for example, the ground;
- the drain of transistor 1500 is taken to a positive potential; and
- the gate of transistor 1500 is taken to a positive potential greater than the threshold voltage of transistor 1500.

This causes a trapping of charges 1510 (here, electrons) in gate oxide layer 1504. The charges 1510 trapped in layer 1504 are, in FIG. 15, symbolized by crosses (x). Charges 1510 originate from an electron channel 1512 (Electron channel) formed in layer 1502 between regions 1508-1 and 1508-2, and at the interface between layer 1502 and layer 1504.

The trapping of electrons 1510 in layer 1504 causes a positive offset $\Delta V_{TH}$ of threshold voltage $V_{TH}$, called positive bias temperature instability (pBTI).

Figure 16:
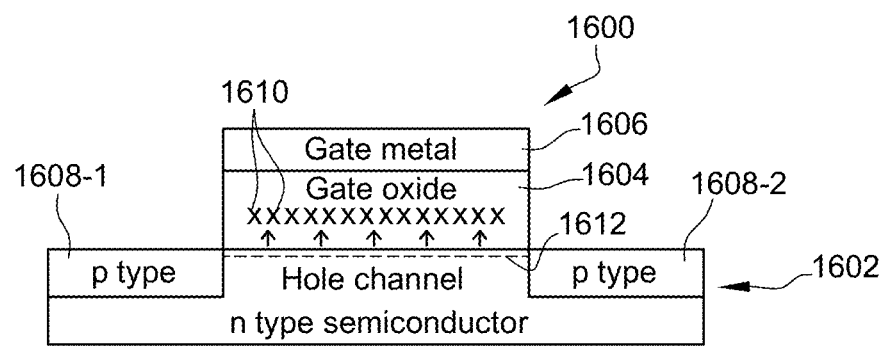
FIG. 16 is a partial simplified view of another transistor in another operating mode.

FIG. 16 is a partial simplified view of another transistor 1600 in another operating mode.

Transistor 1600 is a p-channel MOS transistor (pMOS) comprising:
- a layer 1602 (n-type semiconductor) made of an n-type doped semiconductor material;
- a gate oxide layer 1604 (Gate oxide), located on top of and in contact with a portion of layer 1602;
- a gate metal layer 1606 (Gate metal), located on top of and in contact with gate oxide layer 1604; and
- two regions 1608-1 (p-type) and 1608-2 (p-type) made of a p-type doped semiconductor material, formed in layer 1602 on either side of gate oxide layer 1604.

It is assumed that regions 1608-1 and 1608-2 are respectively connected to the source and to the drain of transistor 1600. It is further assumed that:
- the source of transistor 1600 is taken to a null potential, for example, the ground;
- the drain of transistor 1600 is taken to a negative potential; and
- the gate of transistor 1600 is taken to a negative potential smaller than the threshold voltage of transistor 1600.

This causes a trapping of charges 1610 (here, holes) in gate oxide layer 1604. The charges 1610 trapped in layer 1604 are, in FIG. 16, symbolized by crosses (x). Charges 1610 originate from a hole channel 1612 (Hole channel) formed in layer 1602 between regions 1608-1 and 1608-2, at the interface between layer 1602 and layer 1604.

The trapping of holes 1510 in layer 1604 causes a negative offset $\Delta V_{TH}$ of threshold voltage $V_{TH}$, called negative bias temperature instability (nBTI).

The transistor 100 discussed in relation with FIG. 1 being a transistor of nMOS type, that is, exhibiting no holes, it is not expected to observe a negative offset $\Delta V_{TH}$ of the threshold voltage $V_{TH}$ of transistor 100 when a negative potential $V_G$ is applied to its gate. However, the inventors have observed that the fact of taking the gate of transistor 100 to a negative potential $V_G$ progressively causing, over time, a negative offset $\Delta V_{TH}$.

Figure 17:
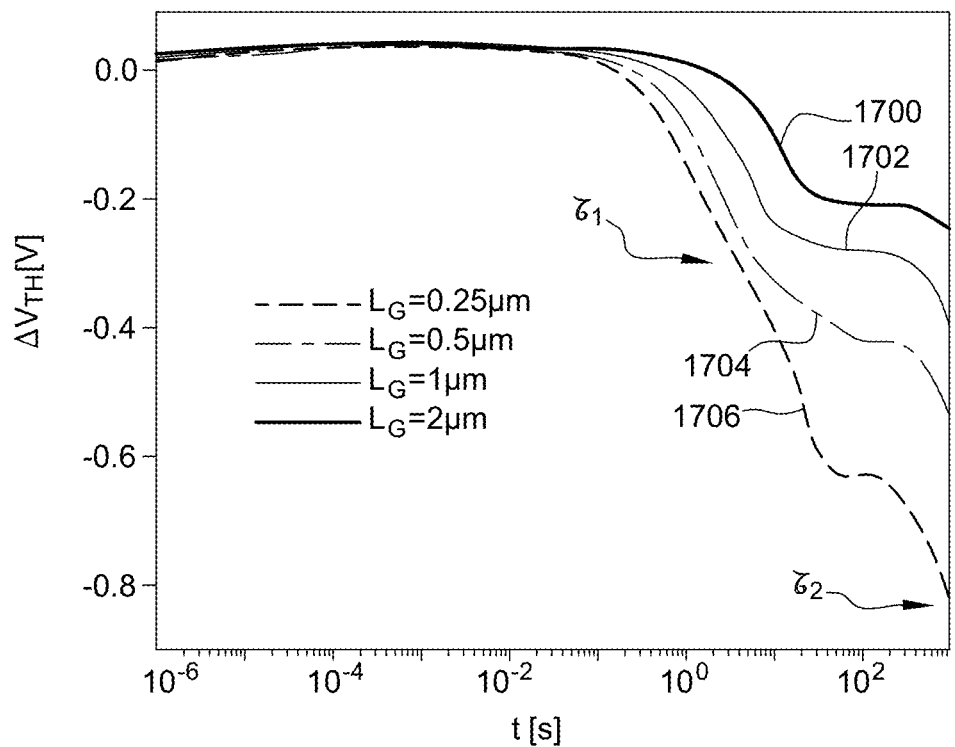
FIG. 17 is a graph of the time variation of an offset of a threshold voltage of electronic components.

FIG. 17 is a graph of the variation, over time tin seconds (s), of an offset $\Delta V_{TH}$ in volts (V) of a threshold voltage $V_{TH}$ of electronic components, for example, transistors similar to transistor 100 but having different gate lengths $L_G$.

The graph of FIG. 17 particularly comprises:
- a curve 1700 of the variation of the offset $\Delta V_{TH}$ of the threshold voltage $V_{TH}$ of a transistor 100 having a gate length $L_G$ equal to 2 µm ($L_G$=2 µm);
- a curve 1702 of the variation of the offset $\Delta V_{TH}$ of the threshold voltage $V_{TH}$ of a transistor 100 having a gate length $L_G$ equal to 1 µm ($L_G$=1 µm);
- a curve 1704 of the variation of the offset $\Delta V_{TH}$ of the threshold voltage $V_{TH}$ of a transistor 100 having a gate length $L_G$ equal to 0.5 µm ($L_G$=0.5 µm); and
- a curve 1706 of the variation of the offset $\Delta V_{TH}$ of the threshold voltage $V_{TH}$ of a transistor 100 having a gate length $L_G$ equal to 0.25 µm ($L_G$=0.25 µm).

The curves 1700, 1702, 1704, and 1706 of FIG. 17 are obtained, for example, for a potential $V_{Gstress}$ of −5 V, a gate width of 200 µm, and a temperature of twenty-five degrees Celsius (25° C.). As illustrated in FIG. 17, a decrease in the gate length $L_G$ of transistor 100 tends to increase the offset $\Delta V_{TH}$ of threshold voltage $V_{TH}$. FIG. 17 further illustrates the presence, for each curve 1700, 1702, 1704, and 1706, of the time constants $\tau_1$ and $\tau_2$ previously described in relation with FIG. 10.

Figure 18:
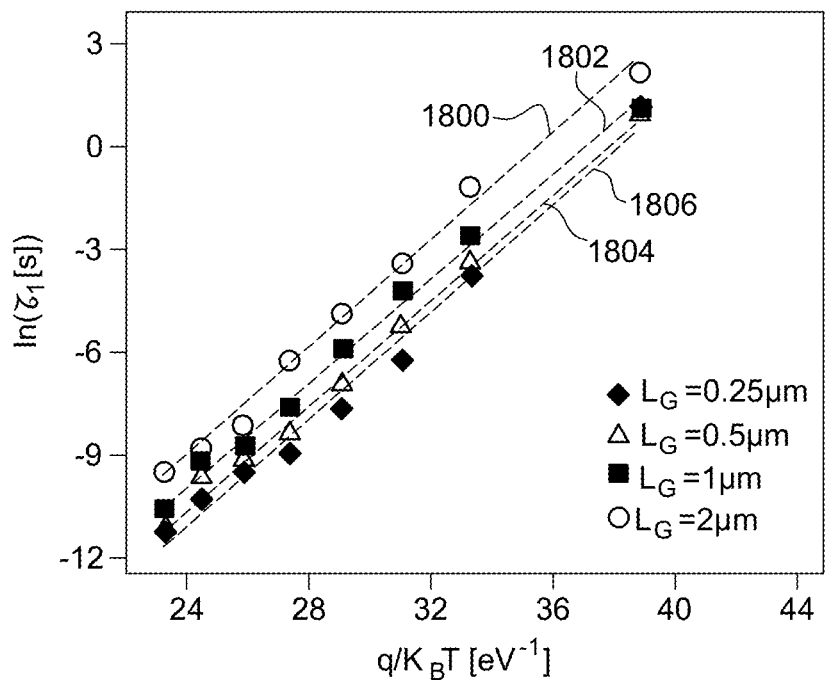
FIG. 18 is an Arrhenius graph associated with a first time constant.

FIG. 18 is an Arrhenius plot associated with time constant $\tau_1$. FIG. 18 particularly illustrates, for different gate lengths $L_G$, the variation of the natural logarithm of time constant $\tau_1$ ($\ln(\tau_1)$) according to a quotient noted $q/K_BT$ (in $eV^{-1}$), where:
- q stands for the elementary charge, approximately equal to $1.6 \cdot 10^{-19}$ C;
- $K_B$ stands for Boltzmann's constant, approximately equal to $8.6 \cdot 10^{-5}$ eV·K$^{-1}$; and
- T stands for the absolute temperature, expressed in degrees Kelvin.

The graph of FIG. 18 particularly comprises:
- a curve 1800 corresponding to a transistor 100 having a gate length $L_G$ equal to 2 µm ($L_G$=2 µm);
- a curve 1802 corresponding to a transistor 100 having a gate length $L_G$ equal to 1 µm ($L_G$=1 µm);
- a curve 1804 corresponding to a transistor 100 having a gate length $L_G$ equal to 0.5 µm ($L_G$=0.5 µm); and
- a curve 1806 corresponding to a transistor 100 having a gate length $L_G$ equal to 0.25 µm ($L_G$=0.25 µm).

The curves 1800, 1802, 1804, and 1806 of FIG. 18 are obtained, for example, for a potential $V_{Gstress}$ of −5 V and a gate length of 200 µm. Curves 1800, 1802, 1804, and 1806 are lines substantially having a same slope, corresponding to an activation energy equal to approximately 0.8 eV.

Figure 19:
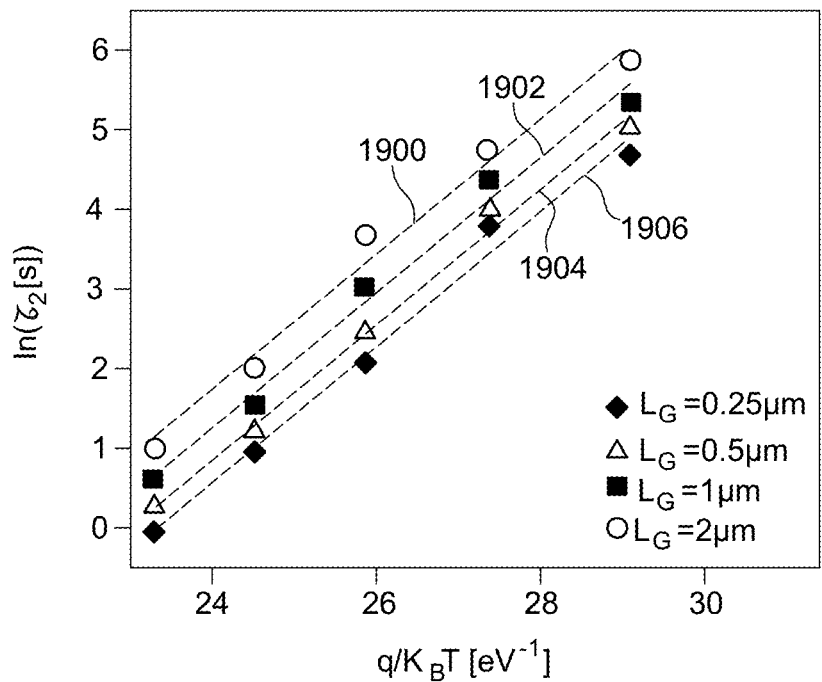
FIG. 19 is an Arrhenius graph associated with a second time constant.

FIG. 19 is an Arrhenius plot associated with time constant $\tau_2$. FIG. 19 particularly illustrates, for different gate lengths $L_G$, the variation of the natural logarithm of time constant $\tau_2$ ($\ln(\tau_2)$) according to quotient $q/K_BT$ (in $eV^{-1}$) described hereabove in relation in FIG. 18.

The graph of FIG. 19 particularly comprises:
a curve 1900 corresponding to a transistor 100 having a gate length $L_G$ equal to 2 μm ($L_G$=2 μm);
a curve 1902 corresponding to a transistor 100 having a gate length $L_G$ equal to 1 μm ($L_G$=1 μm);
a curve 1904 corresponding to a transistor 100 having a gate length $L_G$ equal to 0.5 μm ($L_G$=0.5 μm); and
a curve 1906 corresponding to a transistor 100 having a gate length $L_G$ equal to 0.25 μm ($L_G$=0.25 μm).

The curves 1900, 1902, 1904, and 1906 of FIG. 19 are obtained, for example, for a potential $V_{Gstress}$ of −5 V and a gate length of 200 μm. Curves 1900, 1902, 1904, and 1906 are lines substantially having a same slope, corresponding to an activation energy equal to approximately 0.8 eV.

Starting from the observation of FIGS. 18 and 19, the inventors have observed that the activation energies associated with time constants $\tau_1$ and $\tau_2$ were both substantially equal to 0.8 eV. It is considered that this corresponds to an ionization energy of the nitrogen site carbon atoms in a gallium nitride layer.

Figure 20:
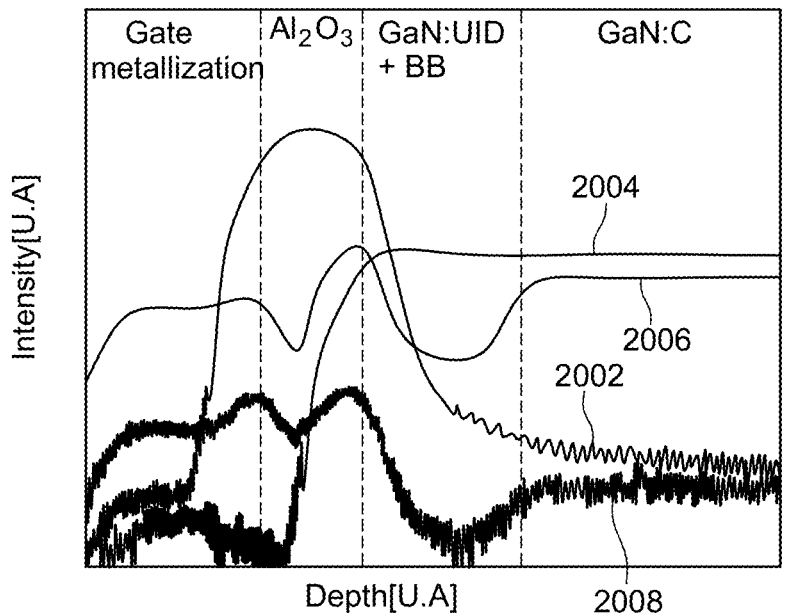
FIG. 20 is a graph of the variation according to a depth of a chemical species concentration.

FIG. 20 is a graph of the variation, according to a depth, in arbitrary units, of a chemical species concentration (Intensity), in arbitrary units. The depth is, in FIG. 20, referenced to gate electrode 114G (FIG. 1).

The graph of FIG. 20 is, for example, obtained by secondary ion mass spectrometry (SIMS) at the upper surface of portion 124 of transistor 100 (FIG. 1). The SIMS spectroscopy is for example performed after a wet etching of TEOS layer 120 by a 30 min exposure to a 10% hydrofluoric acid (HF) solution. This enables to improve the resolution of the measurement.

The graph of FIG. 20 comprises four depth areas:
an area (Gate metallization) corresponding to the thickness of gate electrode 114G;
another area ($Al_2O_3$) corresponding to gate oxide layer 116;
still another area (GaN:UID+BB) corresponding to the cumulated thicknesses of layers 110 and 108; and
still another area (GaN:C) corresponding to layer 106.

In FIG. 20:
a curve 202 shows a variation of the aluminum oxide concentration;
another curve 2004 shows a gallium nitride concentration variation;
still another curve 2006 shows a carbon nitride concentration variation; and
still another curve 2008 shows a carbon concentration variation.

As illustrated in FIG. 20, curve 2006 reveals a high carbon nitride concentration in carbon-doped gallium nitride layer 106. Curve 2006 further reveals a large carbon population in the vicinity of the interface between layer 116 and layer 110.

Figure 21:
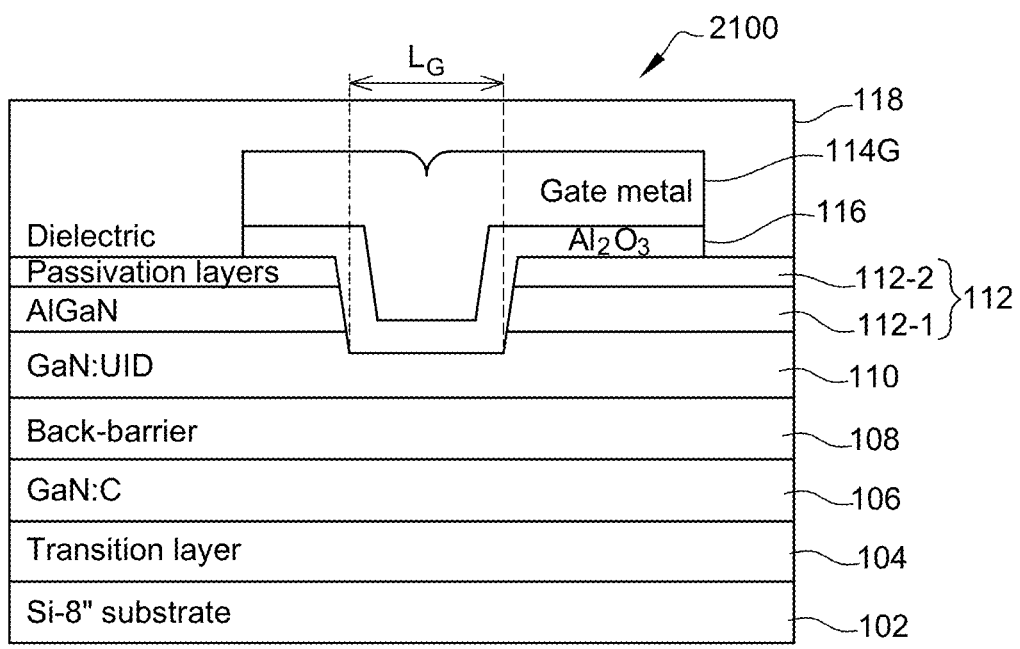
FIG. 21 is a partial simplified cross-section view of a normally-off transistor.

FIG. 21 is a partial simplified cross-section view of a normally-off transistor 2100.

Transistor 2100 has, for example, a structure similar to that of transistor 100 as discussed hereabove in relation with FIG. 1. Transistor 2100 particularly comprises:
silicon substrate 102 (Si-8" substrate);
transition layer 104 (Transition layer);
carbon-doped gallium nitride layer 106 (GaN:C);
barrier layer 108 (Back-barrier);
unintentionally doped gallium nitride layer 110 (GaN: UID);
layer 112, comprising aluminum gallium sub-layer 112-1 (AlGaN) and passivation sub-layer 112-2 (Passivation layers);
gate oxide layer 116 ($Al_2O_3$);
gate metal electrode 114G (Gate metal); and
layer 118 (Dielectric) based on dielectric materials.

As illustrated in FIG. 21, layer 116 is "U"-shaped. Layer 116 totally crosses layer 112 and penetrates into layer 110. Gate electrode 114G is located on top of and in contact with layer 116. In other words, transistor 2100 has a recessed gate in GaN:UID layer 110.

In the example of FIG. 21, gate length $L_G$ corresponds to the length of the lower portion of the "U" formed by layer 116.

Figure 22:
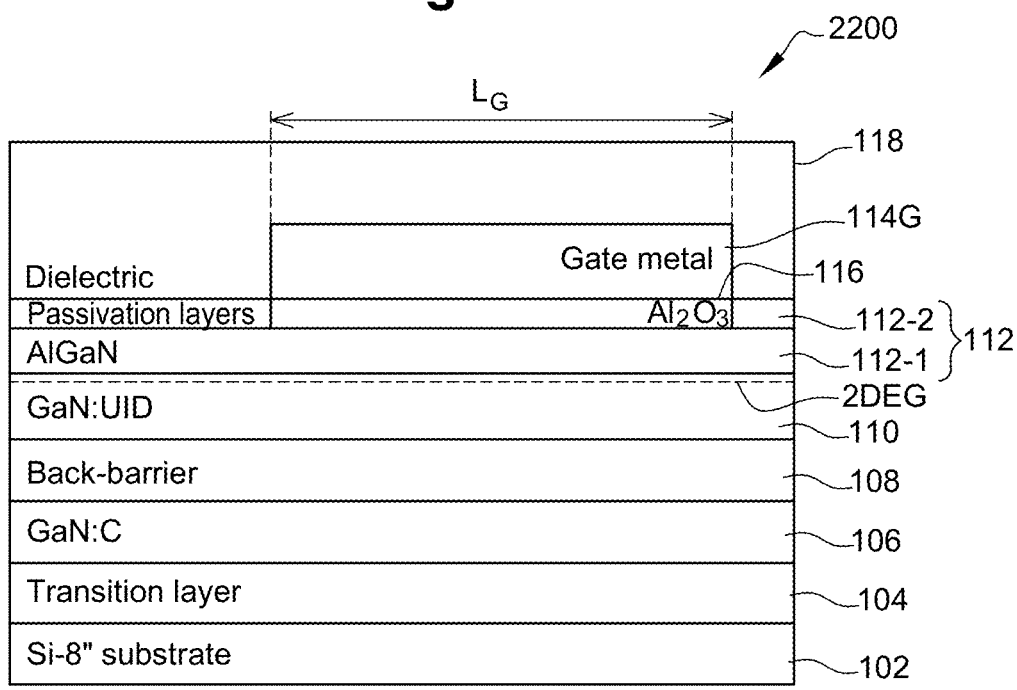
FIG. 22 is a partial simplified cross-section view of a normally-on transistor.

FIG. 22 is a partial simplified cross-section view of a normally-on transistor 2200. The transistor 2200 of FIG. 22 comprises elements common with the transistor 2100 of FIG. 21. The common elements will not be detailed again hereafter.

The transistor 2200 of FIG. 22 differs from the transistor 2100 of FIG. 21 mainly in that transistor 2200 has a "non-recessed" gate. In particular, gate oxide layer 116 ($Al_2O_3$) does not cross layer 112 and does not penetrate into layer 110.

As illustrated in FIG. 22:
gate oxide layer 116 ($Al_2O_3$) penetrates into passivation sub-layer 112-2; and
gate electrode 114G (Gate metal), located on top of and in contact with layer 116, is covered with layer 118 (Dielectric).

The two-dimensional electron gas 2DEG is formed in layer 110 (GaN:UID), in the vicinity of the interface between layer 110 and sub-layer 112-1 (AlGaN).

Figure 23:
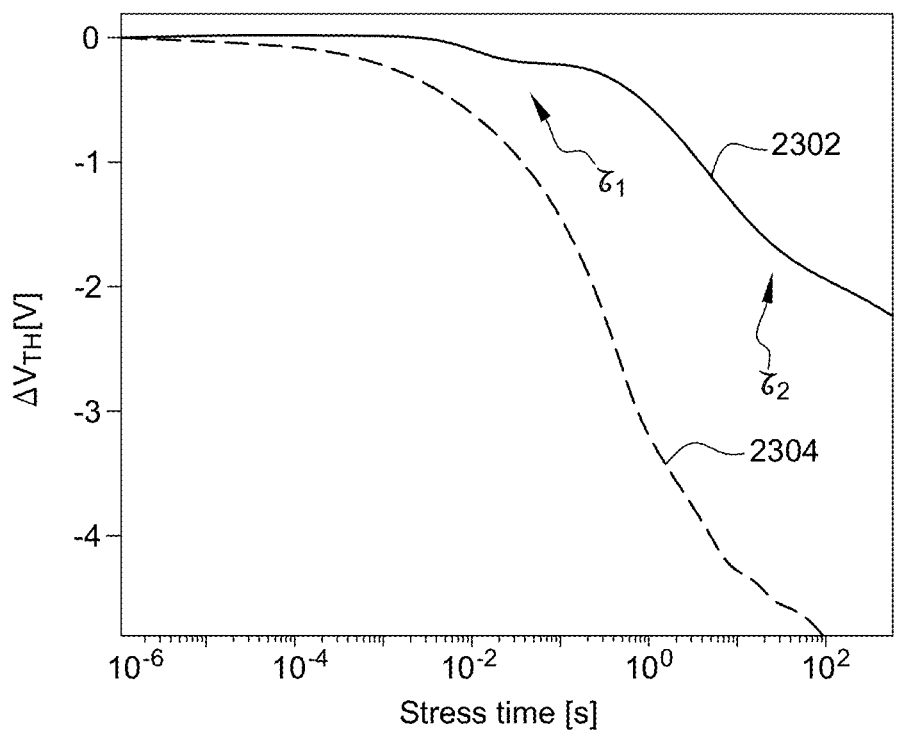
FIG. 23 is a graph of the time variation of an offset of a threshold voltage of the transistors of FIGS. 21 and 22.

FIG. 23 is a graph of the variation, over time (Stress time), in seconds (s), of an offset $\Delta V_{TH}$ of a threshold voltage, in volts (V), of the transistors 2100 and 2200 of FIGS. 21 and 22, respectively.

Graph 23 particularly comprises:
a curve 2302 corresponding to the variation of the offset $\Delta V_{TH}$ of the threshold voltage of the normally-off transistor 2100 of FIG. 21; and
another curve 2304 corresponding to the variation of the offset $\Delta V_{TH}$ of the threshold voltage of the normally-on transistor 2200 of FIG. 22.

Transistors 2100 and 2200 have a gate length $L_G$ equal to 1 μm and a gate width equal to 100 μm. Curves 2302 and 2304 are obtained by applying bias voltages, respectively, of −5 V and of −10 V, and by heating transistors 2100 and 2200 to a temperature of one hundred and fifty degrees Celsius (150° C.).

The curve 2302 corresponding to normally-off transistor 2100 has two stages having time constants $\tau_1$ and $\tau_2$ associated therewith, as discussed hereabove in relation with FIG. 10. The curve 2304 corresponding to normally-on transistor 2200 has a single stage having another time constant associated therewith. The graph of FIG. 23 seems to indicate that time constant $\tau_2$ corresponds to GaN:C layer 106.

Figure 24:
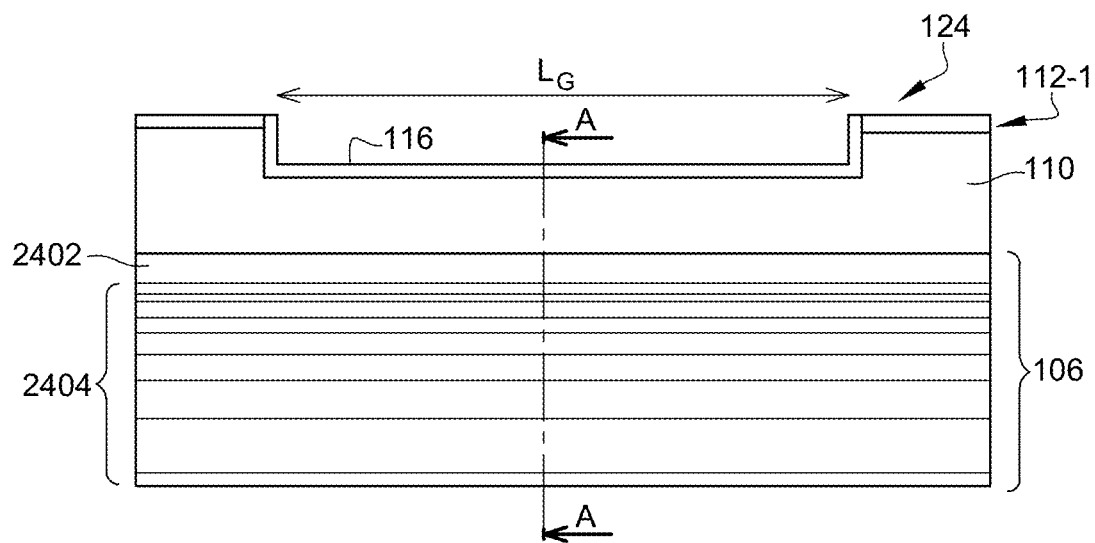
FIG. 24 is a mapping of ionized traps inside of the portion of FIG. 2 of the transistor of FIG. 1 in an operating mode.

FIG. 24 is a mapping of ionized traps inside of portion 124 of FIG. 2 of the transistor 100 of FIG. 1 in an operating mode. The traps here correspond to nitrogen site carbon atoms in GaN:C layer 106. It is here considered, for simplification, that layer 108 is omitted from stack 124. Transistor 100 has a gate length $L_G$ equal to 1 μm.

FIG. 24 more particularly illustrates a situation prior to the application of potential $V_{GStress}$ (FIG. 7) to the gate of transistor 100. In such a situation, most of the ionized traps of layer 106 are located under gate oxide layer 116, in an area 2402 located close to the interface between layer 106 and layer 110. Areas 2404 distant from the interface between layer 106 and layer 110, that is, more distant from this interface than area 2402, however have a lower ionized trap concentration.

Figure 25:
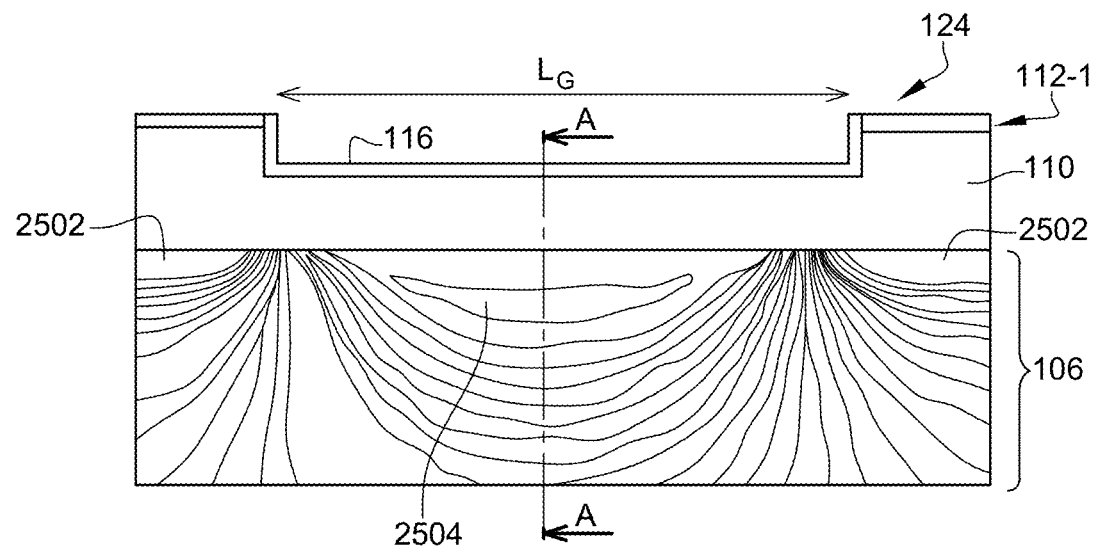
FIG. 25 is a mapping of ionized traps inside of the portion of FIG. 2 of the transistor of FIG. 1 in another operating mode.

FIG. 25 is a mapping of ionized traps inside of the portion 124 of FIG. 2 of the transistor 100 of FIG. 1 in another operating mode. The traps here again correspond to nitrogen site carbon atoms in GaN:C layer 106. It is here again considered, for simplification, that layer 108 is omitted from stack 124. Transistor 100 has a gate length $L_G$ equal to 1 µm.

FIG. 25 more particularly illustrates a situation 1 µs after the application, for $10^3$ s, of potential $V_{GStress}$ (FIG. 7) to the gate of transistor 100. Potential $V_{GStress}$ is here equal to −5 V. In such a situation, most of the ionized traps of layer 106 are located on either side of gate oxide layer 116, in areas 2502 located close to the interface between layer 106 and layer 110. An area 2504 located under layer 116 and close to the interface between layer 106 and layer 110 has, as illustrated in FIG. 25, a lower ionized trap concentration. Such a lower ionized trap concentration under the gate oxide layer 116 of transistor 100 seems to be responsible for the offset $\Delta V_{TH}$ of the threshold voltage of transistor 100.

Figure 26:
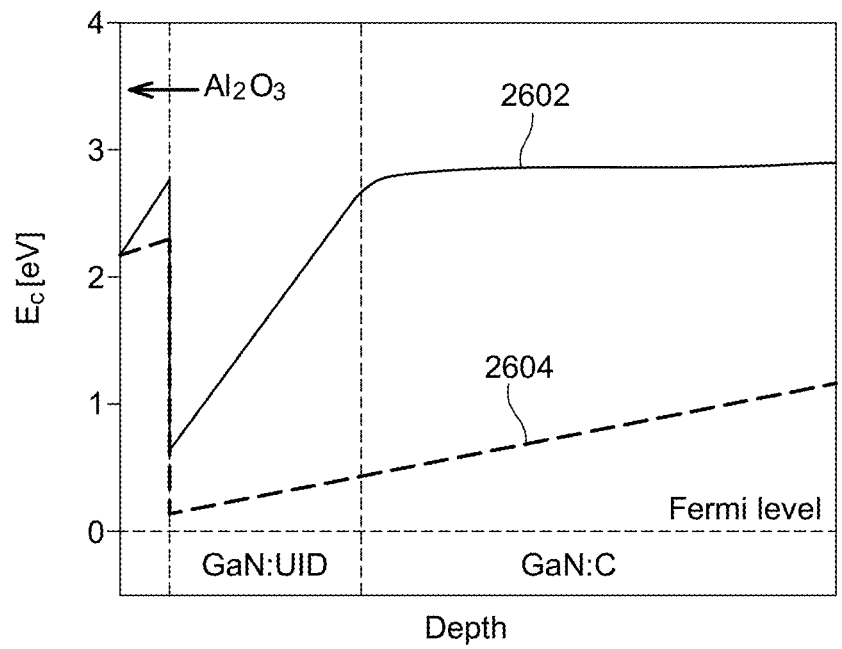
FIG. 26 is a graph of the variation, according to a depth, of a conduction band energy.

FIG. 26 is a graph of the variation, according to a depth (Depth), of a conduction band energy ($E_C$), in electron-volts (eV), as compared with the Fermi level. FIG. 26 illustrates, in particular, the variation of conduction band energy $E_C$:
along a cross-section AA in the operating mode of FIG. 24 (curve 2602); and
along cross-section AA in the operating mode of FIG. 25 (curve 2604).

The graph of FIG. 26 comprises three depth areas:
an area ($Al_2O_3$) corresponding to gate oxide layer 116;
another area (GaN:UID) corresponding to layer 110; and
still another area (GaN:C) corresponding to layer 106.

It can be observed, as illustrated in FIG. 25, that the application of potential $V_{GStress}$ (FIG. 7) to the gate of transistor 100 tends to lower the conduction band energy in GaN:C layer 106. Before the application of potential $V_{GStress}$, the traps formed by the nitrogen site carbon atoms of layer 106 are ionized and behave as negative charges. During the application of negative potential $V_{GStress}$, the electrons initially captured by the ionized traps are repelled under the effect of the electric field. This has the effect of neutralizing the traps and causes a decrease in threshold voltage $V_{TH}$.

Figure 27:
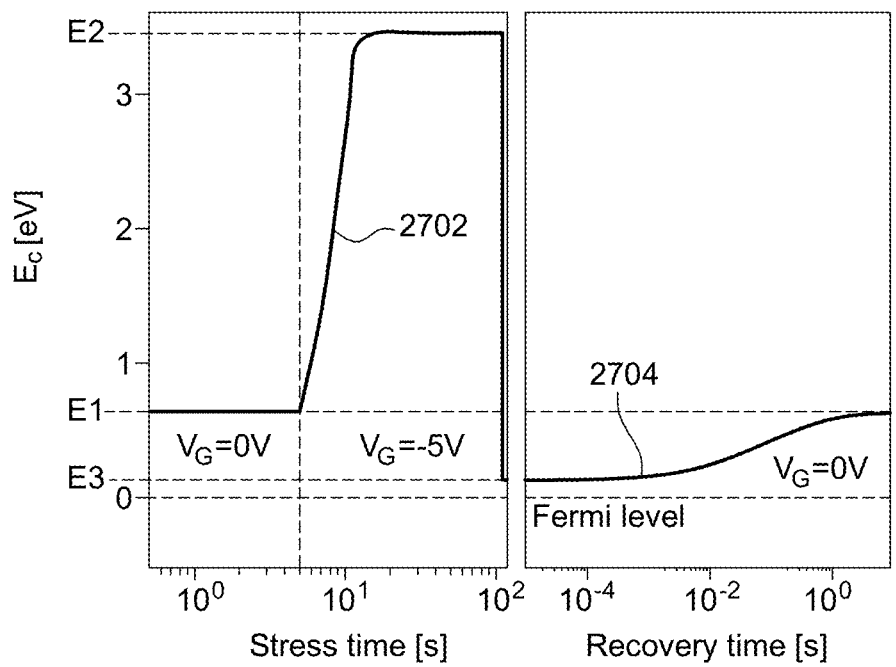
FIG. 27 is a graph of the time variation of a conduction band energy.

FIG. 27 is a graph of the variation, over time, in seconds (s), of the conduction band energy ($E_C$), in electron-volts (eV), referenced to the Fermi level. Energy $E_C$ is for example measured at a depth of approximately 1 nm under the middle of the gate of transistor 100.

The graph of FIG. 27 comprises a first period (Stress time, curve 2702) during which gate potential $V_G$ is first null (area $V_G=0$ V). Energy $E_C$ is then equal to a value, noted E1. Still during the first period, the gate potential $V_G$ is then equal to −5 V (area $V_G=-5$ V). Energy $E_C$ then increases to another value, noted E2, greater than value E1. At the end of the first period, gate potential $V_G$ is taken down to a null value. Energy $E_C$ then rapidly decreases to still another value, noted E3, smaller than values E1 and E2.

During a second period (Recovery time, curve 2704), subsequent to the first period, gate potential $V_G$ is maintained at a null value ($V_G=0$ V). Energy $E_C$ then slowly increases from value E3 to reach, after approximately 10 s, initial value E1.

Curves 2702 and 2704 are comparable with a dynamic variation of the threshold voltage $V_{TH}$ of transistor 100. In FIG. 26, it can in particular be observed that the offset $\Delta V_{TH}$ of the threshold voltage $V_{TH}$ of transistor 100 becomes null after a time period approximately equal to 10 s after the application of gate potential $V_G$.

Various embodiments and variants have been described. Those skilled in the art will understand that certain features of these various embodiments and variants may be combined, and other variants will occur to those skilled in the art. In particular, the application of the implementation mode of the method described in relation with FIG. 4 to the case of MOS capacitor 1200 (FIG. 12) is within the abilities of those skilled in the art based on the above indications.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing an electronic component, comprising steps of:
    estimating an electric capacitance of a stack interposed between a first epitaxial carbon-doped gallium nitride layer and a first electrode of the component;
    heating the component;
    measuring an offset of a threshold voltage of the component;
    deducing therefrom a surface concentration of carbon atoms occupying nitrogen sites of the gallium nitride crystal structure in the first epitaxial carbon-doped gallium nitride layer; and
    adapting epitaxy parameters of the first epitaxial carbon-doped gallium nitride layer according to the estimation of the surface concentration of carbon atoms occupying nitrogen sites of the gallium nitride crystal structure.

2. The method according to claim 1, further comprising a step of calculating, based on the surface concentration and on a partial thickness of the first layer, a volume concentration of carbon atoms occupying nitrogen sites of the gallium nitride crystal structure in the first epitaxial carbon-doped gallium nitride layer.

3. The method according to claim 1, wherein the heating of the component is performed at a temperature in the range from one hundred to two hundred and fifty degrees Celsius, preferably from one hundred and fifty to two hundred and fifty degrees Celsius.

4. The method according to claim 1, wherein the stack forms, with the first electrode a MOS-type structure comprising:
    a second gallium nitride layer, located on the first epitaxial carbon-doped gallium nitride layer; and
    a third alumina layer, penetrating into the second gallium nitride layer, the first electrode being located on top of and in contact with the third alumina layer.

5. The method according to claim 4, wherein the capacitance is estimated according to respective thicknesses and dielectric permittivities of the second layer and of the third layer.

6. The method according to claim 1, wherein the first layer is located on a substrate, preferably a silicon wafer with a {111} orientation.

7. The method according to claim 1, wherein the offset of the threshold voltage of the component is determined at the end of a step of application, between the first electrode and a second electrode of the component, of a negative bias voltage.

8. The method according to claim 7, wherein the bias voltage is smaller than −1 V, preferably approximately equal to −5 V.

9. The method according to claim 7, wherein the step of application of the bias voltage lasts for from one to ten thousand seconds, preferably from one hundred to ten thousand seconds.

10. The method according to claim 7, wherein the step of application of the bias voltage is interrupted, for from ten to one hundred microseconds, several times to estimate the threshold voltage of the component.

11. The method according to claim 10, wherein the threshold voltage of the component is estimated based on a measurement of the variation of the capacitance, between the first electrode and the second electrode, according to a variation of the potential applied to the first electrode.

12. The method according to claim 10, wherein the threshold voltage of the component is estimated based on a measurement of the variation of an electric current crossing the component, according to a variation of the potential applied to the first electrode.

13. The method according to claims claim 1and 6, wherein the component is a transistor, preferably a high electron mobility transistor, the first electrode being a gate electrode and the second electrode being an electrode connected to the substrate.

14. The method according to claim 1, wherein the component is a MOS capacitor.

15. The method according to claim 1, wherein epitaxy parameters of the first layer are adapted according to the estimation of the nitrogen site carbon concentration.

16. The method according to claim 6, wherein the component is a transistor, preferably a high electron mobility transistor, the first electrode being a gate electrode and the second electrode being an electrode connected to the substrate.

* * * * *

UNITED STATES PATENT AND TRADEMARK OFFICE
CERTIFICATE OF CORRECTION

PATENT NO. : 11,761,920 B2
APPLICATION NO. : 17/094621
DATED : September 19, 2023
INVENTOR(S) : Abygael Viey et al.

Page 1 of 1

It is certified that error appears in the above-identified patent and that said Letters Patent is hereby corrected as shown below:

In the Claims

At Column 22, Claim 13, Line 4:
"The method according to claims claim land 6,"

Should read:
--The method according to claim 7,--

Signed and Sealed this
Twelfth Day of December, 2023

Katherine Kelly Vidal
*Director of the United States Patent and Trademark Office*